(12) United States Patent
Rasmussen et al.

(10) Patent No.: US 6,992,247 B2
(45) Date of Patent: Jan. 31, 2006

(54) TOOLLESS MOUNTING SYSTEM AND METHOD FOR AN ADJUSTABLE SCALABLE RACK POWER SYSTEM

(75) Inventors: Neil Rasmussen, Concord, MA (US); William Ziegler, Reading, MA (US); Peter Francis, Seaconk, MA (US)

(73) Assignee: American Power Conversion Corporation, West Kingston, RI (US)

( * ) Notice: Subject to any disclaimer, the term of this patent is extended or adjusted under 35 U.S.C. 154(b) by 0 days.

(21) Appl. No.: 10/284,835

(22) Filed: Oct. 31, 2002

(65) Prior Publication Data

US 2003/0121689 A1 Jul. 3, 2003

Related U.S. Application Data

(63) Continuation-in-part of application No. 10/038,106, filed on Jan. 2, 2002.

(51) Int. Cl.
*H02G 3/04* (2006.01)

(52) U.S. Cl. ............... 174/48; 174/68.1; 174/68.3; 174/72 A; 361/826; 385/135

(58) Field of Classification Search ............... 174/68.1, 174/68.3, 100, 48, 49, 135, 72 A, 65 R, 99 R; 361/825, 826, 827, 829, 683; 385/134, 135; 312/265.1, 257.1, 265.3, 265.5; D13/155; 211/162, 182, 26, 189; 248/49, 68.1, 58, 248/73, 51

See application file for complete search history.

(56) References Cited

U.S. PATENT DOCUMENTS

| 2,860,742 | A |   | 11/1958 | Waters, Sr. et al. |
|-----------|---|---|---------|---------------------|
| 3,968,322 | A | * | 7/1976  | Taylor ............. 174/72 A |
| 4,158,754 | A | * | 6/1979  | Yonezaki et al. ...... 361/827 |
| 4,320,261 | A |   | 3/1982  | Scerbo et al. |
| 4,366,390 | A |   | 12/1982 | Rathmann |
| 4,497,411 | A | * | 2/1985  | DeBortoli .......... 211/26 |
| 4,608,499 | A |   | 8/1986  | Rathmann |

(Continued)

OTHER PUBLICATIONS

International Search Report for PCT/US02/08330 mailed Jan. 15, 2003.

*Primary Examiner*—Dean A. Reichard
*Assistant Examiner*—Angel R. Estrada
(74) *Attorney, Agent, or Firm*—Lowrie, Lando & Anastasi, LLP

(57) ABSTRACT

Systems and method for installing computer equipment and power distribution equipment in facilities is provided. In one aspect, the present invention provides a power distribution rack, and uninterruptible power supply rack and a plurality of equipment racks. A plurality of power cables are run from the power distribution rack to each of the plurality of equipment racks using power cable tracks located on the roofs of the equipment racks. A plurality of data cables run between the plurality of equipment racks using data cable tracks located on the roofs of the equipment racks. The power cable tracks and data cable tracks are designed to be installed on the roofs of the equipment racks without the need for tools.

13 Claims, 12 Drawing Sheets

U.S. PATENT DOCUMENTS

| | | | | |
|---|---|---|---|---|
| 4,641,225 A | * | 2/1987 | Reichle | 361/827 |
| 4,656,767 A | | 4/1987 | Tarrant | |
| 4,860,168 A | * | 8/1989 | Wiljanen et al. | 361/827 |
| 5,184,025 A | | 2/1993 | McCurry et al. | |
| 5,260,864 A | | 11/1993 | Simonelli et al. | |
| 5,274,808 A | | 12/1993 | Miyao et al. | |
| 5,291,383 A | | 3/1994 | Oughton | |
| 5,384,792 A | | 1/1995 | Hirachi | |
| 5,450,272 A | * | 9/1995 | Van Gaal et al. | 361/825 |
| 5,457,600 A | | 10/1995 | Campbell et al. | |
| 5,596,479 A | | 1/1997 | Campbell et al. | |
| 5,639,048 A | * | 6/1997 | Bartholomew et al. | 248/68.1 |
| 5,677,831 A | | 10/1997 | Lin | |
| 5,686,768 A | | 11/1997 | Thomsen et al. | |
| 5,694,312 A | | 12/1997 | Brand et al. | |
| 5,764,503 A | | 6/1998 | Brand et al. | |
| 5,969,292 A | | 10/1999 | Snider, Jr. et al. | |
| 5,982,652 A | | 11/1999 | Simonelli et al. | |
| 5,998,732 A | * | 12/1999 | Caveney et al. | 174/48 |
| 6,129,316 A | * | 10/2000 | Bauer | 248/68.1 |
| 6,201,319 B1 | | 3/2001 | Simonelli et al. | |
| 6,215,064 B1 | | 4/2001 | Noble et al. | |
| 6,301,095 B1 | | 10/2001 | Laughlin et al. | |
| 6,310,783 B1 | | 10/2001 | Winch et al. | |
| 6,365,830 B1 | | 4/2002 | Snider, Jr. et al. | |
| 6,373,721 B2 | | 4/2002 | Lecinski et al. | |
| 6,411,506 B1 | | 6/2002 | Hipp et al. | |
| 6,431,501 B1 | * | 8/2002 | Molek | 248/68.1 |
| 6,437,243 B1 | * | 8/2002 | VanderVelde et al. | 174/68.3 |
| 6,541,704 B1 | | 4/2003 | Levenson et al. | |
| 6,541,705 B1 | * | 4/2003 | McGrath | 174/68.3 |
| 6,586,673 B1 | | 7/2003 | Socarras | |
| 6,603,073 B2 | * | 8/2003 | Ferris | 174/68.3 |
| 6,651,362 B2 | | 11/2003 | Caveney | |

* cited by examiner

TOOLLESS MOUNTING SYSTEM AND METHOD FOR AN ADJUSTABLE SCALABLE RACK POWER SYSTEM

The present application is a continuation-in-part of U.S. patent application Ser. No. 10/038,106 filed Jan. 2, 2002, entitled Adjustable Scalable Rack Power System and Method, currently pending.

FIELD OF THE INVENTION

The present invention relates generally to a system and method for providing power distribution and mounting facilities for electronic equipment, and more specifically to methods and apparatus for installing and powering computers and related equipment in data centers and other facilities without the need for additional hardware or tools.

BACKGROUND OF THE INVENTION

Centralized data centers for computer, communications and other electronic equipment have been in use for a number of years, and more recently, with the increasing use of the Internet, large scale data centers that provide hosting services for Internet Service Providers (ISPs), Application Service Providers (ASPs) and Internet content providers are become increasingly popular. Typical centralized data centers contain numerous racks of equipment that require power, cooling and connections to communications facilities. It is common in data centers to use raised flooring, beneath which power cables and communication cables may be run between racks of equipment and to facility distribution panels. In addition, it is common to use the space beneath the raised flooring as an air plenum to provide cooling to the racks of equipment. In some facilities, in place of, or in addition to the use of raised flooring, overhead cable ladders are used to route cables throughout the facility. These cable ladders are typically fastened to support members in the ceiling of the facility.

It is often desirable to operate equipment within data centers seven days a week, 24 hours per day, with little or no disruption in service. To prevent any disruption in service, it is common practice in data centers to use uninterruptible power supplies (UPSs) to ensure that the equipment within the data centers receives continuous power throughout any black out or brown out periods. Typically, data centers are equipped with a relatively large UPS at the main power distribution panel for the facility. Often, the UPS is a 480 volt 3 phase unit that is selected to have sufficient capacity to meet the power requirements for all of the equipment within the facility.

Equipment within data facilities typically have 120 volt or 208 volt input power requirements, and a power distribution unit having a step down transformer is often used between the output of the UPS and power feeds for equipment racks to lower the 480 volt input voltage to 120 volts or 208 volts for the equipment racks. A circuit breaker panel is typically either installed in the PDU or mounted near the PDU.

There are several drawbacks with the traditional design of data centers. First, raised flooring is expensive and cannot be easily accommodated in some facilities, such as those that do not have high ceilings. Second, the routing of cables under raised floors often creates "rats' nests" and it often becomes difficult, if not impossible, to locate particular cables beneath a raised floor. Further, when it is desired to add new equipment to a data center having a raised floor, it is often difficult to pull cables past existing cables under the floor, and the build up of cables beneath a floor often prevents cooling air from flowing beneath the floor to electronic equipment racks. In addition, in many locations, building codes require that expensive metal clad cabling be used for power cables that are located beneath raised floors.

The use of cable ladders that run along the ceiling of a data center overcomes many of the drawbacks of raised floors discussed above, however, the use of cable ladders also has several drawbacks. Cable ladders are somewhat difficult to install, and like raised floors, cannot be readily accommodated in facilities that do not have high ceilings. Typically, when cable ladders are used, the location of the ladders is determined during the initial design of the data center. If it later becomes necessary to add new equipment to the data center or to move equipment, the location of the ladders may not be in close proximity to equipment racks, requiring long runs of cables to racks. Further, cable ladders and runs of cables from the ladders to equipment racks are typically fully in view and often cause a data center to appear to be overcrowded and/or cluttered.

Furthermore, installation of cable ladders can be complicated and requires a great deal of planning and installation labor. Many pieces of loose hardware need to be assembled and attached to the ceiling. These hardware pieces generally require multiple tools for assembly. Furthermore, many sections of threaded rod are needed for suspending the cable ladders from the ceiling. Each section of the rod needs to be cut and deburred for installation. In order to make changes to the cable ladder design, the process has to be repeated. Multiple tools are required to disassemble the existing cable ladders and to reassemble them in new locations and patterns. Although some sections of threaded rod may be removed and reused, new sections may also need to be created. The use of existing sections requires removal and reinstallation at new locations.

Another drawback in the design of traditional data centers involves the difficulty in selecting the size of a UPS for the facility. As briefly discussed above, many newer data centers are used as web hosting facilities that essentially lease space and utilities to Internet content providers or Internet Service Providers. Often when these data centers are initially designed, the final power requirements for the facility are not known, and it is often not for some time, if ever, that a facility becomes fully occupied. If the UPS is selected for full capacity, and the facility is operated at substantially below full capacity for some time, then the overhead costs of the facility may become undesirably high due to the cost of the UPS. Further, there are power losses associated with a UPS. If a UPS is operated at substantially below full capacity, then these losses may become significant when compared with the total power consumption of the facility. If a UPS for a facility is selected for less than full capacity, then it may have to be replaced, at considerable cost, when the usage of the facility increases.

In some facilities, UPSs are distributed throughout the facility allowing smaller UPSs to be used, and providing greater flexibility. One problem with this approach is that installation of the UPS along with the wiring to racks often requires an electrician. In addition, a power distribution unit is often needed between each of the distributed UPSs and the loads that they power. These power distribution units are often bulky items that do not fit well within data centers, and/or may require placement near a wall on which a circuit breaker panel can be mounted.

SUMMARY OF THE INVENTION

A first aspect of the present invention is directed to an adaptable power and mounting system for equipment. The system includes a plurality of equipment racks, each one of the equipment racks has at least a first power input to receive power to power equipment contained in each of the equipment racks. The system further includes a first power distribution rack that provides power to the equipment racks, the first power distribution rack including a power distribution panel and a plurality of output power cables, each having a first end coupled to the power distribution panel and a second end having a mating connector that mates with the first power input of at least one of the plurality of equipment racks.

The plurality of equipment racks and the first power distribution rack can be designed to be installed in a facility in a predetermined arrangement, whereby each rack is at a predetermined distance from the power distribution rack, wherein each of the plurality of cables mates with a respective one of the plurality of equipment racks, and each one of the plurality of cables has a length based on the predetermined distance between the power distribution rack and the respective one of the plurality of equipment racks for the one of the plurality of cables. The first power distribution rack can further include a main power input to receive input power having a first voltage value from a first power source, and a transformer coupled to the main power input and to each of the plurality of output power cables to provide output power having a second voltage, lower than the first voltage, to the plurality of output power cables.

Each of the plurality of equipment racks can have a second power input, and the system can further include a second power distribution rack that provides power to the plurality of equipment racks, the second power distribution rack including a power distribution panel and a plurality of output power cables, each having a first end coupled to the power distribution panel of the second power distribution rack and a second end having a mating connector that mates with the second power input of one of the plurality of equipment racks. The second power distribution rack can further include a main power input to receive input power having a first voltage value from a second power source, and a transformer coupled to the main power input and to each of the output power cables of the second power distribution rack to provide output power having a second voltage, lower than the first voltage, to the plurality of output power cables of the second power distribution rack. The plurality of equipment racks can be arranged in a type of row having a first end and a second end, with the first power distribution rack being adjacent the first end of the row and the second power distribution rack being adjacent the second end of the row.

Each of the plurality of equipment racks can include at least one receptacle unit having a plurality of power outlets to provide power to equipment in the racks. At least one of the receptacle units in one of the equipment racks can have a power cord having a connector that functions as the power input for the one of the plurality of equipment racks. At least one of the receptacle units in one of the plurality of equipment racks can be removably mounted to the one of the equipment racks using a snap fit. The power provided to at least one of the plurality of equipment racks from the first power distribution rack can be three phase power, and the outlets of a receptacle unit in the one of the plurality of equipment racks can be arranged in at least three groups with at least one outlet in each group being constructed to provide single phase power from one of the three phases of the input power. The receptacle unit in at least one of the plurality of equipment racks can have an over current device that interrupts power to at least one outlet upon detection of an over current condition. Each one of the plurality of power cables can include a label that indicates the respective equipment rack for the one of the power cables.

The system can further include a first communications network, and a plurality of the receptacle units and the power distribution rack can include a communications circuit coupled to the first communications network. The system can further include a consolidator unit having a first communications circuit coupled to the first communication network to communicate with the plurality of receptacle units and the power distribution rack to receive status information. The consolidator unit can further include a second communications circuit to communicate with a second communications network. The first communications network can be a power line carrier based network, and the second communications network can be an Internet protocol based network.

Each one of the plurality of equipment racks can have a roof section with a power cable track mounted on the roof section, wherein the power cable track is constructed and arranged to contain a portion of at least one of the plurality of power cables to route the one of the power cables from the power distribution rack to one of the plurality of equipment racks. The roof section can have an opening to allow a power cable to pass from the power cable track to within the rack or from within the rack to the roof of the rack. The power cable track of a first one of the plurality of equipment racks can be constructed and arranged to mate with the power cable track of an adjacent second one of the plurality of equipment racks to form a continuous power cable track across the roof sections of the first one of the plurality of equipment racks and the second one of the plurality of equipment racks. The power cable tracks can have connectors for attaching a power cable track to a roof section of an equipment rack without the need for tools or additional hardware. According to one aspect of the invention, attachment tabs on the power cable track mate with attachment holes in the roof section.

Each of the plurality of equipment racks can include a data cable track mounted on the roof section, and each of the data cable tracks and the power cable tracks can have a length that is greater than a width, and each one of the data cable tracks can be mounted on the roof of an equipment rack such that the length of the one of the data cable tracks is substantially parallel to the length of a power cable track mounted on the roof of the equipment rack. Each one of the power cable tracks can be mounted on risers on the roof to provide a space between the one of the power cable tracks and the roof to allow a data cable to pass from a data cable track on the roof beneath the one of the power cable tracks and through the opening in the roof. The data cable tracks can have connectors for attaching a data cable track to a roof section of an equipment rack without the need for tools or additional hardware. According to one aspect of the invention, attachment tabs on the data cable track mate with attachment holes in the roof section. The data cable tracks may also be formed of two partitions positionable along either side of a track for the data cables. The data cables can lay directly on the roof section of the equipment racks.

The system can further include a bridge power cable track configured to mate with a power cable track on a first one of the plurality of equipment racks and to mate with a power cable track on a second one of the plurality of equipment racks to provide a continuous power cable track from the first one of the plurality of equipment racks to the second one of the plurality of equipment racks, wherein the first one of the plurality of equipment racks and the second one of the equipment racks are separated by an aisle with the bridge power cable track passing over the aisle. Similarly, the system can further include a bridge data cable track configured to mate with a data cable track on a first one of the plurality of equipment racks and to mate with a data cable track on a second one of the plurality of equipment racks to provide a continuous data cable track from the first one of the plurality of equipment racks to the second one of the plurality of equipment racks. The bridge power cable track and bridge data cable track can mate with the respective power cable tracks and data cable tracks at different levels to provide separation of the data and power cables. The bridge power cable track and bridge data cable track can include brackets for attachment to the respective power cable track or data cable track. The power cable tracks and data cable tracks include slots in the sides for attaching the bridge brackets without the need for tools or additional hardware.

The system can further include an uninterruptible power supply (UPS) having a plurality of power modules and battery modules, the UPS being positioned adjacent the first power distribution rack and having an input coupled to the first power distribution rack to receive input power from the first power distribution rack and having an output to provide one of the input power and backup power derived from the battery modules to the first power distribution rack.

Another aspect of the present invention is directed to an adaptable power and mounting system for equipment. The system includes a plurality of equipment racks, each one of the equipment racks having at least a first power input to receive power to power equipment contained in each of the equipment racks, a first power distribution rack that provides power to the equipment racks, the first power distribution rack including a power distribution panel and a first plurality of output power cables, each having a first end coupled to the power distribution panel and a second end that mates with the first power input of at least one of the plurality of equipment racks, and an uninterruptible power supply (UPS) having at least one battery, the UPS being positioned adjacent the first power distribution rack and having an input coupled to the first power distribution rack to receive input power from the first power distribution rack and having an output to provide one of the input power and backup power derived from the at least one battery to the first power distribution rack. The first power distribution rack further includes a bypass switch having a first input to receive input power, a first output to provide the input power to the UPS, a second input coupled to the output of the UPS and a second output, wherein the bypass switch has a first electrical position in which the first input is coupled to the first output and the second input is coupled to the second output and a second electrical position in which the first input is coupled to the second output.

Each of the plurality of equipment racks can have a second power input, and the system can further include a second power distribution rack that provides power to the equipment racks, the second power distribution rack including a power distribution panel and a second plurality of output power cables, each having a first end coupled to the power distribution panel of the second power distribution rack and a second end that mates with the second power input of at least one of the plurality of equipment racks.

In yet another aspect of the present invention, an adaptable power and mounting system includes a plurality of equipment racks, each one of the equipment racks having at least a first power input to receive power to power equipment contained in each of the equipment racks, and a first power distribution rack that provides power to the equipment racks, the first power distribution rack including a power distribution panel and a plurality of output power cables, each having a first end coupled to the power distribution panel and a second end that mates with the first power input of at least one of the plurality of equipment racks. Each one of the plurality of equipment racks has a roof section with a power cable track mounted on the roof section, wherein the power cable track is constructed and arranged to contain a portion of at least one of the plurality of power cables to route the one of the power cables from the first power distribution rack to one of the equipment racks. The roof section can have an opening to allow a power cable to pass from the power cable track to within an equipment rack or from within the equipment rack to the roof of the rack. The power cable track of a first one of the equipment racks can be constructed and arranged to mate with the power cable track of an adjacent second one of the equipment racks to form a continuous power cable track across the roof sections of the first one of the equipment racks and the second one of the equipment racks.

Yet another aspect of the present invention is directed to a method of installing equipment in a plurality of equipment racks in a facility. The method includes providing a first power distribution rack having a power distribution panel, determining a location for the first power distribution rack and the plurality of equipment racks in the facility, based on the location of the plurality of equipment racks and the first power distribution rack, determining a necessary length of each one of a first plurality of power cables, such that each one of the first plurality of power cables can be coupled between the first power distribution rack and one of the plurality of equipment racks with a first end of each power cable being coupled to the power distribution panel and a second end being coupled to one of the plurality of equipment racks, connecting the first end of each of the first plurality of power cables to the power distribution panel, and installing a connector on the second end of each of the first plurality of cables, the connector being selected to mate with an input connector of each of the plurality of equipment racks.

The method can further include after installing the connectors, packaging the first plurality of cables and the power distribution rack for shipment to the facility. Each of the plurality of equipment racks can include a roof having a power cable track mounted thereon, and the method can further include routing each of the first plurality of power cables out of a hole in the top of the first power distribution rack, routing each of the plurality of power cables through at least one of the power cable tracks, and mating the connector on the second end of each of the first plurality of power cables with a connector of a first power input cable of one of the plurality of equipment racks. The method can further include mounting a first power receptacle unit including the first power input cable in at least one of the plurality of equipment racks, prior to mating the connector on the second end with a connector of the first power input cable. The method can further include providing a second power distribution rack having a power distribution panel, determining a location in the facility of the second power distribution rack, based on the location of the plurality of equipment racks and the second power distribution rack, determining a necessary length of each one of a second plurality of power cables, such that each one of the second plurality of power cables can be coupled between the second power distribution rack and one of the plurality of equipment racks with a first end of each of the second plurality of power cables being coupled to the power distribution panel of the second power distribution rack and a second end being coupled to one of the plurality of equipment racks, connecting the first end of each of the second plurality of power cables to the power distribution panel of the second power distribution rack, installing a connector on the second end of each of the second plurality of cables, the connector being selected to mate with an input connector of each of the plurality of equipment racks.

BRIEF DESCRIPTION OF THE DRAWINGS

For a better understanding of the present invention, reference is made to the drawings which are incorporated herein by reference and in which.

DETAILED DESCRIPTION

Embodiments of the present invention overcome problems associated with data centers described above by providing adaptable power distribution and equipment mounting systems for computers and other electronic devices.

Figure 1:
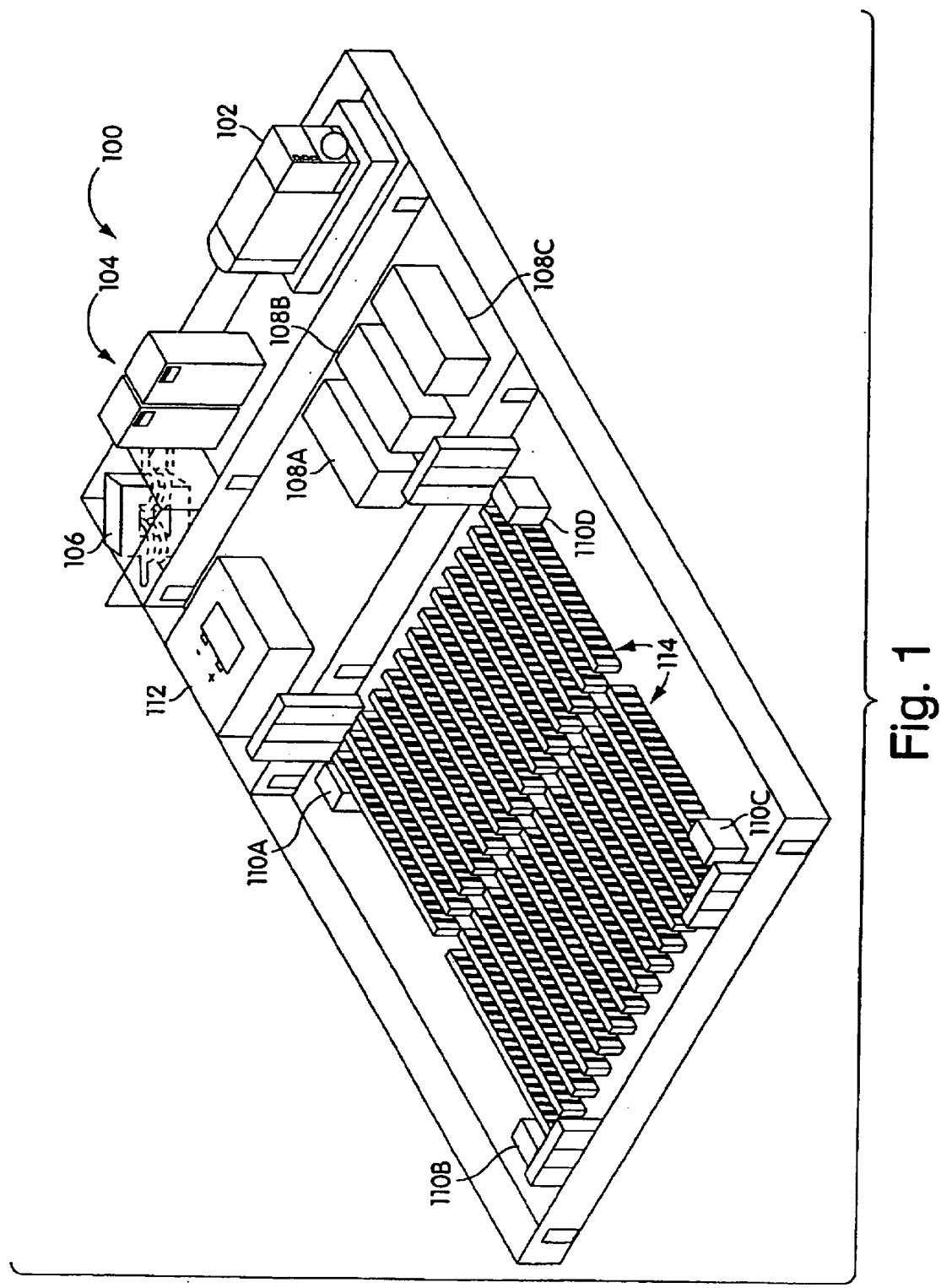
FIG. 1 shows a typical layout of a prior art data center.

FIG. 1 shows a diagram of the layout of a typical data center 100. The data center 100 includes a generator 102, high power switchgear 104, a transformer 106, three UPSs 108A, 108B and 108C, four power distribution units (PDU) 110A, 110B, 110C and 110D, a battery or bank of batteries 112, and twenty-eight rows 114 of racks of equipment. In the data center 100, the transformer 106 is used to lower the voltage of power received from outside the facility or from the generator to a voltage level of typically 480 volts. The switchgear provides switching of the power between the generator and an outside power source and the UPSs. The UPSs in conjunction with the battery 112 provide uninterruptible power to each of the PDUs. Each PDU typically contains a transformer, and power distribution circuitry, such as circuit breakers, for distributing power to each of the racks in the data center. Problems associated with data centers like that shown in FIG. 1 are described above in the Background of the Invention.

Figure 2:
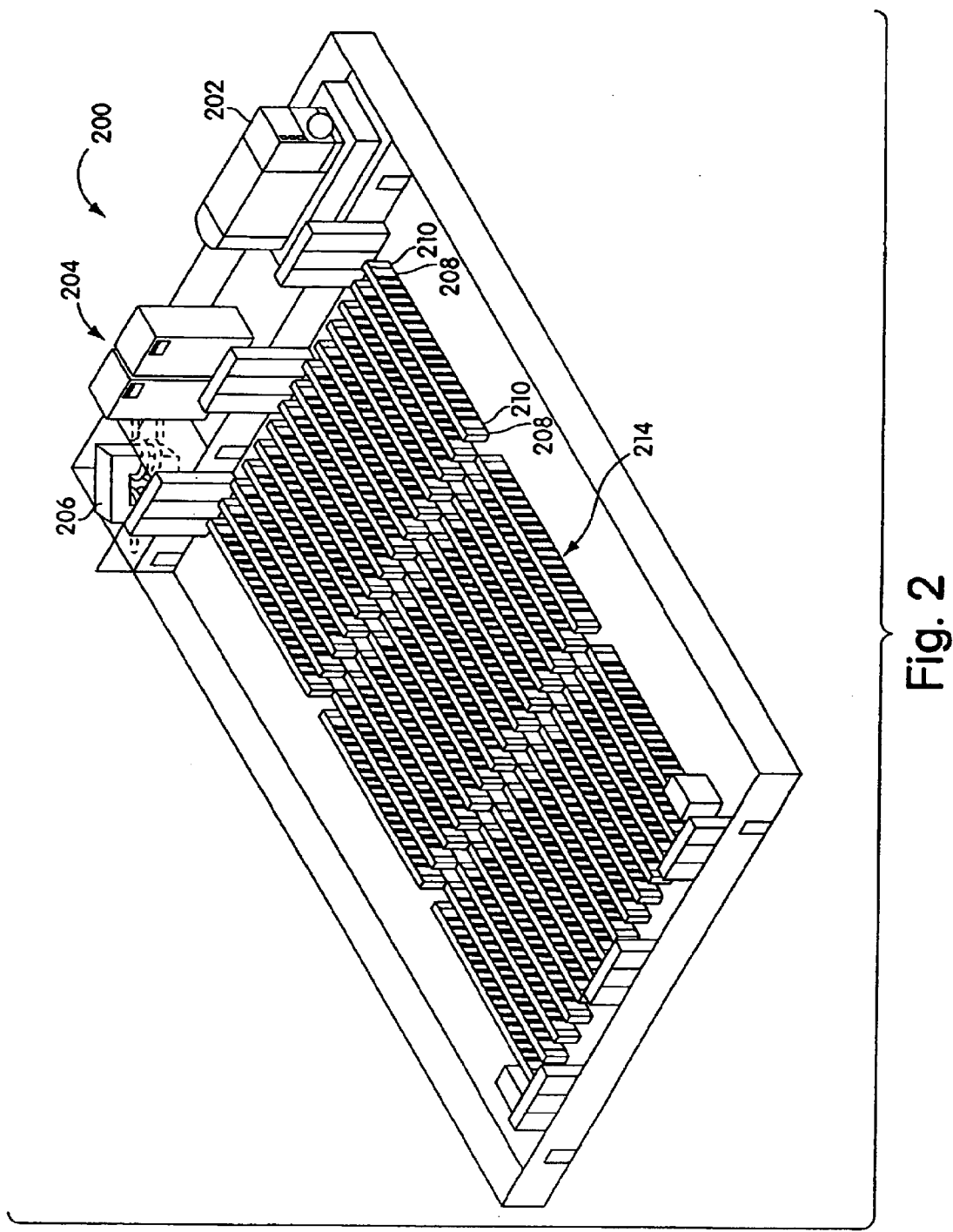
FIG. 2 shows a layout of a data center in accordance with a first embodiment of the present invention.

FIG. 2 shows a diagram of the layout of a data center 200 in accordance with a first embodiment of the present invention. Like data center 100, data center 200 includes a generator 202, switchgear 204, and a transformer 206 and forty-two rows 214 of racks of equipment. Data center 200 differs from data center 100 in that it does not contain the large UPSs 108A, 108B, 108C and 108D, batteries, and the large PDUs 110A, 110B, 110C and 110D of the data center 100. Rather, data center 100 includes UPS racks 208 having batteries and PDU racks 210 that are distributed throughout the racks of equipment. In one embodiment of the present invention, as shown in FIG. 2, each row of equipment 214 includes a UPS rack 208 and a PDU rack 210 located at each end of the row.

Figure 3:
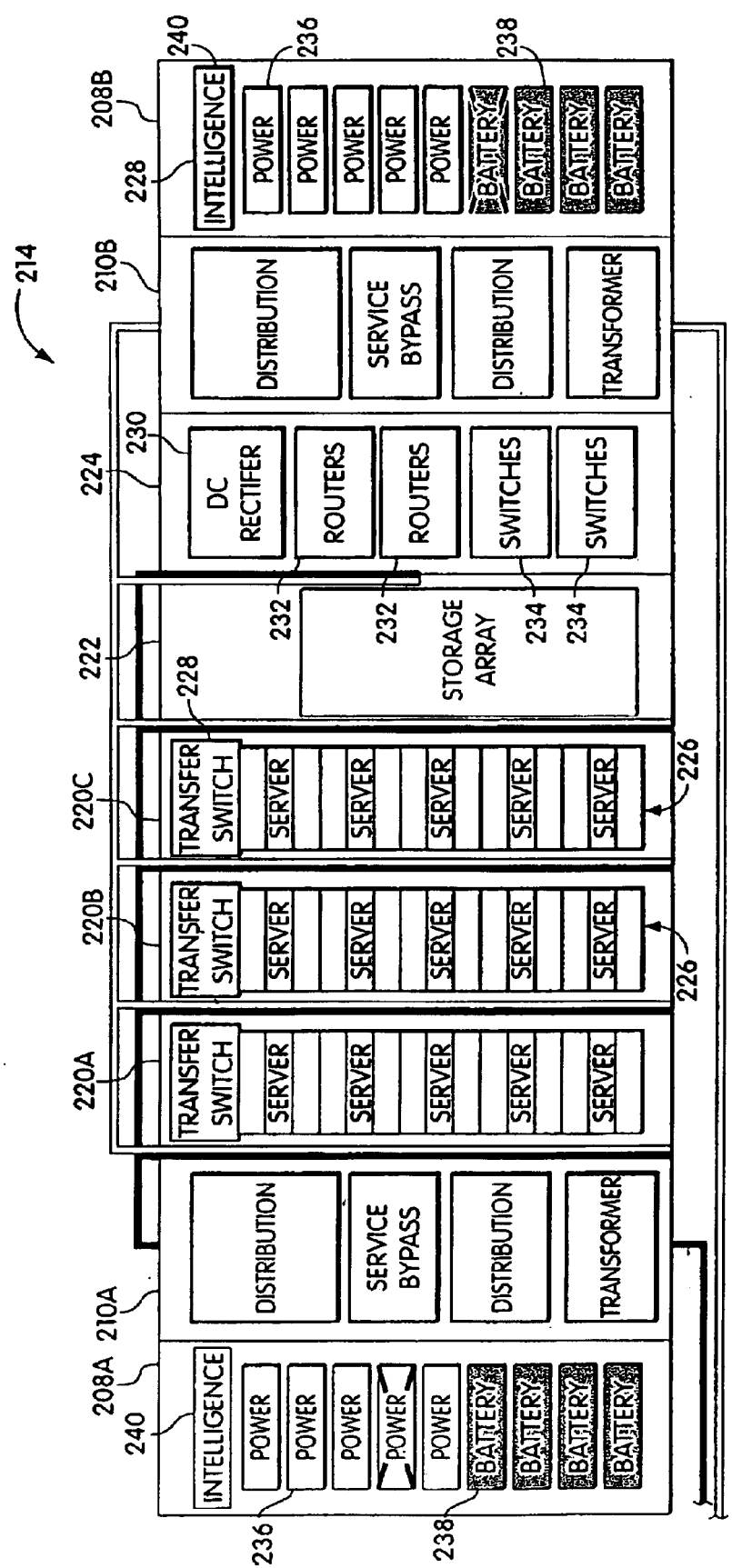
FIG. 3 show a row of equipment racks used in the data center of FIG. 2.

In FIG. 2, each row of racks 214 includes fourteen racks. In embodiments of the present invention, the number of racks and the function of equipment in the racks can vary. FIG. 3 shows an exemplary row of racks 214, used in embodiments of the present invention. The row of racks 214 includes a total of 9 racks, including UPS racks 208A and 208B, PDU racks 210A and 210B, and five equipment racks including three server racks 220A, 220B, and 220C, a storage array rack 222, and a router rack 224. In one embodiment of the present invention, the racks may be modified standard 19 inch racks, such as those available from American Power Conversion Corporation of W. Kingston, R.I. under the trade name NETSHELTER®.

The server racks include a plurality of servers 226 along with a transfer switch 228. As understood by those skilled in the art, the servers may be network servers that are commercially available from a number of sources. The transfer switch 228 is used in some embodiments of the invention to switch between a main source of power and a redundant source of power in the rack. The use of distributed transfer switches in each rack provides significant benefits over prior art systems that have one centrally located transfer switch. In particular, the use of distributed transfer switches in individual racks increases the power availability to the racks by protecting against faults that may occur in the distribution system between the central source of power in a facility and a rack.

The storage array rack 222 is used to house data storage equipment, such as that available from EMC Corporation of Hopkinton, Mass. In addition, the storage array rack can be used for servers, routers or other equipment. In addition, other, non-racked devices, such as tower servers could be powered by power distribution systems of the present invention.

The router rack 224 houses a DC rectifier 230, routers 232 and switches 234. The routers and switches are communication devices that are well known to those skilled in the art. The DC rectifier is used to convert AC power to DC power to power DC devices contained in the router rack.

Each of the UPS racks 208A and 208B includes a modular uninterruptible power supply (UPS). Each UPS includes a plurality of power modules 236, a plurality of battery modules 238, and an intelligence module 240. The intelligence module 240 provides control of subsystems contained within the UPS. The power modules provide regulated output AC power, provide DC charging current for the battery modules, and convert DC power from the battery modules to AC power, upon disruption of facility power. The battery modules provide back up power to the power modules upon disruption of facility power.

In one embodiment, the power modules and the battery modules can be individually added to or removed from the UPS to accommodate different load requirements, thereby providing an economical and expandable design. Further, the use of multiple power modules and battery modules provides redundancy in each of the UPSs by allowing continued operation of the UPSs, despite a failure of any one power module or battery module. In one embodiment, the UPSs may be implemented using a UPS like the Symmetra® UPS available from American Power Conversion Corporation and described in U.S. Pat. No. 5,982,652, titled "Method and Apparatus for Providing Uninterruptible Power," which is incorporated herein by reference. In embodiments of the present invention, the UPS rack may be configured to provide front to back cooling for the components of the UPS.

In the embodiments shown in FIGS. 2 and 3, a UPS rack and one PDU rack is included at each end of the row of racks. As is described further below, the use of two UPSs and two PDUs provides further redundancy in that power can continue to be supplied to the racks in the event that one of the UPSs and/or one of the PDUs completely fails. The use of the two UPSs and PDUs provides the capability to operate in data centers having redundant power sources, and provides redundant power to each of the racks. Some servers and other equipment typically contained in racks in data centers have two power inputs for redundancy purposes. In embodiments of the present invention that provide redundant power, these equipments having redundant inputs can be accommodated. In addition, the use of the transfer switch allows equipment that does not have redundant inputs to be powered from redundant sources. The transfer switch receives power from each of the redundant power systems and provides output power from one of the two input systems.

As understood by those skilled in the art, the present invention is not limited to a system having two UPSs and two PDUs as shown in FIGS. 2 and 3, but rather, includes systems having only one UPS and PDU and more than two UPSs and PDUs.

Figure 4:
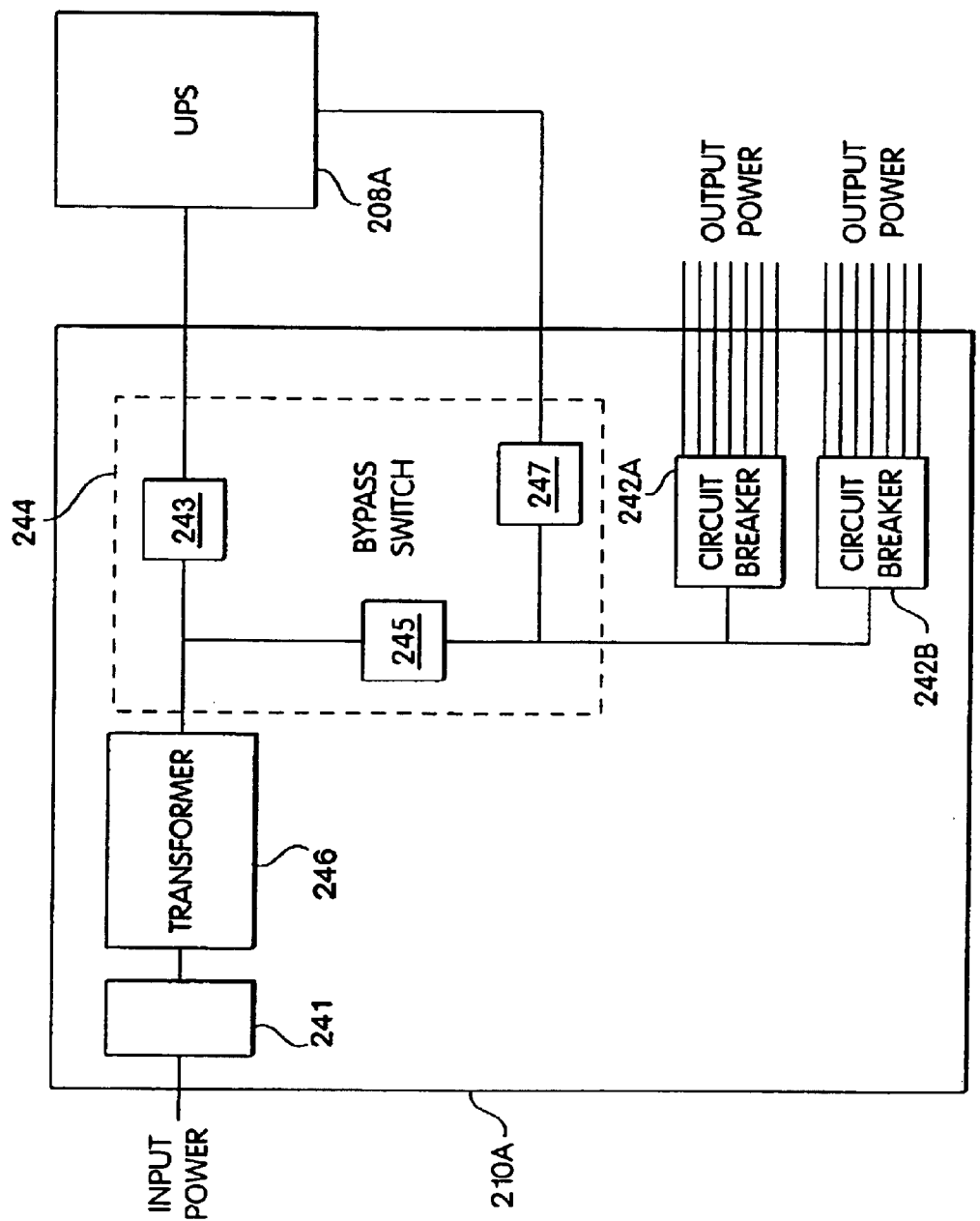
FIG. 4 is a functional block diagram of a power distribution unit and uninterruptible power supply used in the row of equipment racks.

The PDU racks 210A and 210B provide power transformation, circuit breaker protection and distribution of input power to each of the racks in the row. Each PDU rack includes two circuit breaker distribution panels 242A and 242B, a service bypass switch 244, an input circuit breaker 241 and a transformer 246. The service bypass switch includes switches 243, 245 and 247. FIG. 4 shows a functional block diagram of the PDU 210A (PDU 210B being substantially identical to PDU 210A) along with the connections between the PDU and the UPS 208A in one embodiment of the present invention. In the embodiment shown in FIG. 4, the transformer 246 receives the 480 volt, three phase input power of the PDU rack and provides 208 volt, three phase power to the UPS rack. In other embodiments of the present invention, depending on characteristics of the local power, the transformer can be designed for other input voltages and output voltages and the entire PDU may be designed for single phase power. In FIG. 4, for simplicity, a single connection is shown between each of the devices. As understood by those skilled in the art, individual connections for each phase of the power, neutral, and an optional chassis ground are actually provided between each of the devices.

In the embodiment shown in FIG. 4, the UPS rack receives the power from the transformer, and if the input power is within predetermined tolerances, the power is routed back to the PDU rack. If the power is not within tolerances, or if there is a power outage, the UPS rack will switch to battery back-up mode and provide power generated by the UPS to the PDU rack. The distribution panels 242A and 242B contain circuit breakers and provide for a plurality of outlet points from which 208 volt, three phase power can be distributed to the equipment racks. In FIG. 4, the distribution panels have seven outlet circuits. In other embodiments of the present invention, distribution panels having more or less outlet circuits may be used. Further, in embodiments of the present invention, the PDU rack may include fuses and voltage and/or current monitors.

The bypass switch 244 is contained in the PDU and provides for manual bypass of the UPS to provide power directly to the distribution panel upon failure of the UPS, to replace the UPS or for any other reason. The use of the bypass switch in the PDU provides significant advantages in embodiments of the present invention over the prior art by allowing a UPS to be replaced due to failure or for upgrade purposes. In prior art data centers that use 480 volt UPSs, the cost of bypass switches, and the size of the switches that must be used for 480 volt power, often make their use prohibitive.

In the embodiment shown in FIG. 4, the bypass switch actually includes three switches 243, 245 and 247. As will now be described, the use of the three switches provides continuous power when the UPS is switched out, and reduces transients and arcing that can occur during switching. During normal operation, switches 243 and 247 are in the closed position and switch 245 is in the open position to route all power through the UPS. When it is desired to bypass the UPS, switch 245 is first closed and then switches 243 and 247 are open. Similarly, when it is desired to add a UPS back in the system, switches 243 and 247 are closed prior to opening switch 245.

In one embodiment of the present invention, as shown in FIG. 3, input power to the PDU rack is received from underneath the rack through, for example, a raised floor. In other embodiments, the input power to the PDU rack may be received through the roof of the PDU rack, or through the back of the rack. Power from the PDU rack to the UPS rack is run either through the sides of the rack, over the roofs of the racks or through the floor beneath the racks.

In one embodiment of the invention, distribution of power from the distribution panels in the PDU racks to each of the equipment racks is accomplished using a plurality of flexible power cables of various lengths. In the embodiment shown in FIG. 3, the flexible cables are routed through the top of the PDU rack and through overhead tracks to the equipment racks. In this embodiment, each of the power cables is terminated using a standard power connector, and each of the equipment racks has an input power cable having a mating connector for the standard connector on the power cables allowing each of the racks to be simply connected to the PDU without the need of an electrician. In one embodiment, the input power cable for a rack is a power cord of a power receptacle unit mounted in the rack.

Figure 5:
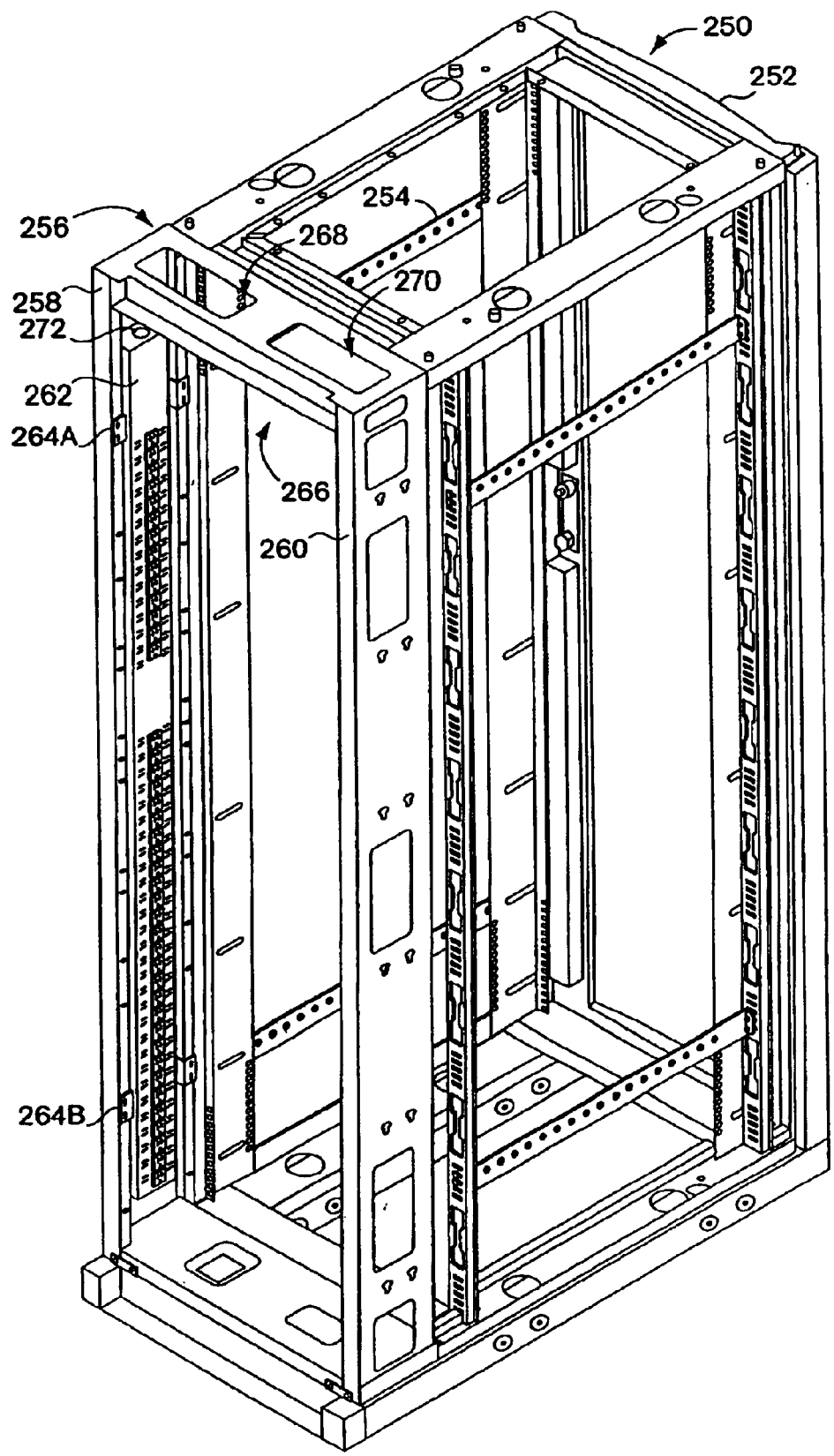
FIG. 5 is a perspective view of the frame of an equipment rack having a power receptacle unit in accordance with one embodiment of the present invention.

FIG. 5 is an isometric view of a rack 250 that in one embodiment is used for the server racks 220A, 220B and 220C. In FIG. 5, the rack 250 includes a front door 252, but is shown without side panels and a back door. The rack includes a front section 254 and a back extension section 256. The front section 254 is used to contain nineteen inch rack-mountable servers and other equipment. The back extension section 256 is used for power and signal distribution between equipment mounted in the rack. The back extension section includes a first side panel 258, a second side panel 260, and a roof section 266. The roof section has a first opening 268 and a second opening 270. The first opening 268 and the second opening are used to pass data and power cables into and out of the racks.

Figure 6:
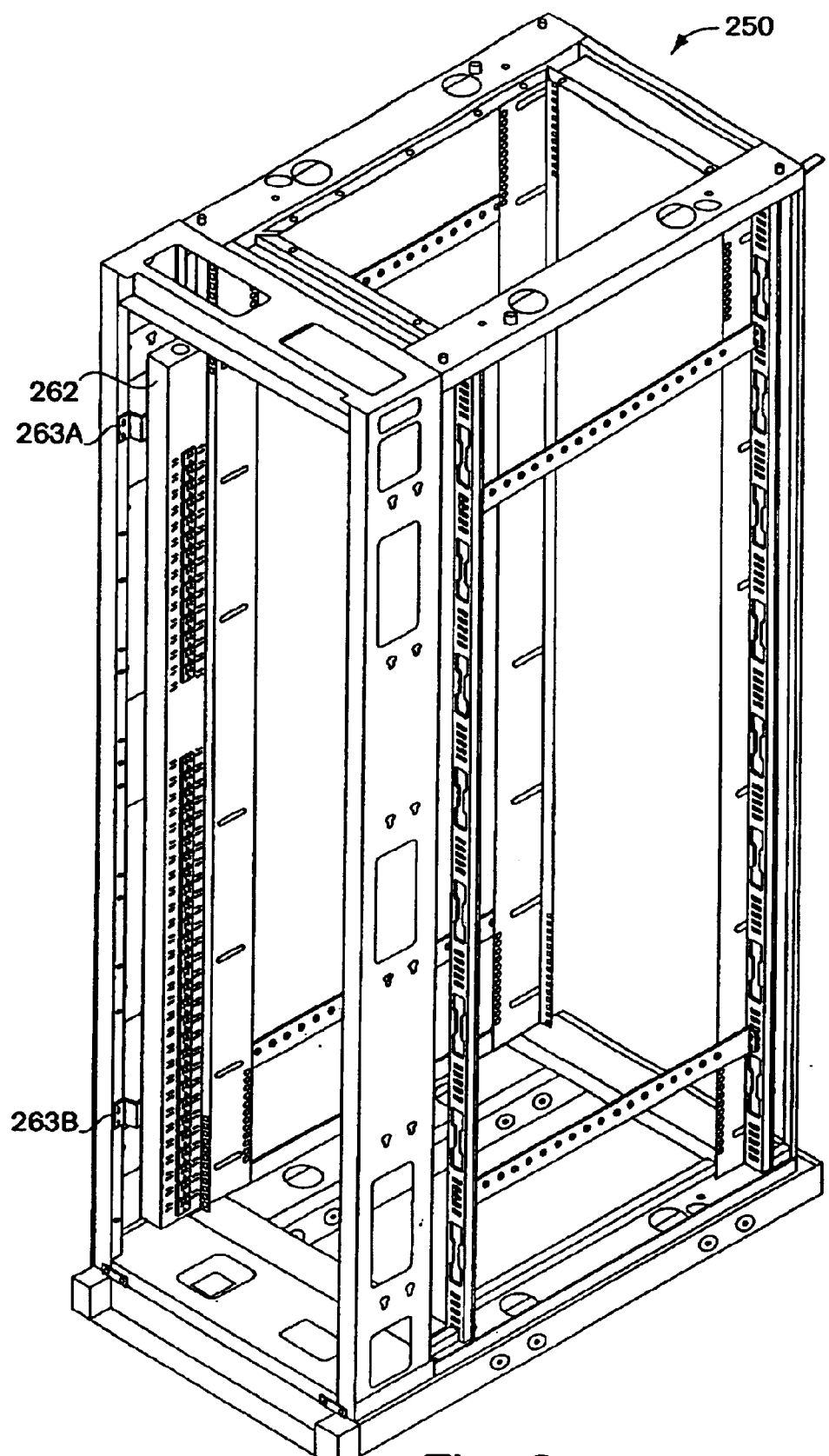
FIG. 6 is a perspective view of the equipment rack of FIG. 5 showing an alternative mounting technique for the power receptacle unit.

In the rack of FIG. 5, a power receptacle unit 262 is mounted to the first side panel 258 using brackets 264A and 264B The power receptacle unit 262 has an opening 272 to receive a power cord (not shown in FIG. 5) for the power receptacle unit. Similarly, a second power receptacle unit may be mounted to the second side panel 260. As shown in FIG. 6, in an alternative embodiment, the power receptacle unit 262 is mounted on raised brackets 263A and 263B. Depending on the configuration of equipment and the back door of the rack, the use of the raised brackets may provide greater accessibility to the power outlets of the power receptacle unit. As described further below, in other embodiments, a power receptacle unit may be mounted to the rack without use of brackets and requiring no tools for installation or removal. In addition to showing the use of raised brackets, the rack 250 of FIG. 6 is also shown with the front door removed.

In one embodiment of the present invention, as will now be described with reference to FIG. 7, one or more of the racks includes an overhead power track and an overhead data track, both of which are attached to the roof of the rack. The power track is used for passing power cables in a side-to-side direction from one rack to another. The data tracks are used for passing data cables in a side-to-side direction from one rack to another. The use of the overhead tracks on the UPS racks is optional depending on the path used to run power between the PDU racks and the UPS racks and to run data cables between the racks. The tracks are designed such that the track of one rack lines up with the tracks of adjacent racks when the racks are positioned side-by-side in order to create a continuous track for a row of racks of any length.

Figure 7:
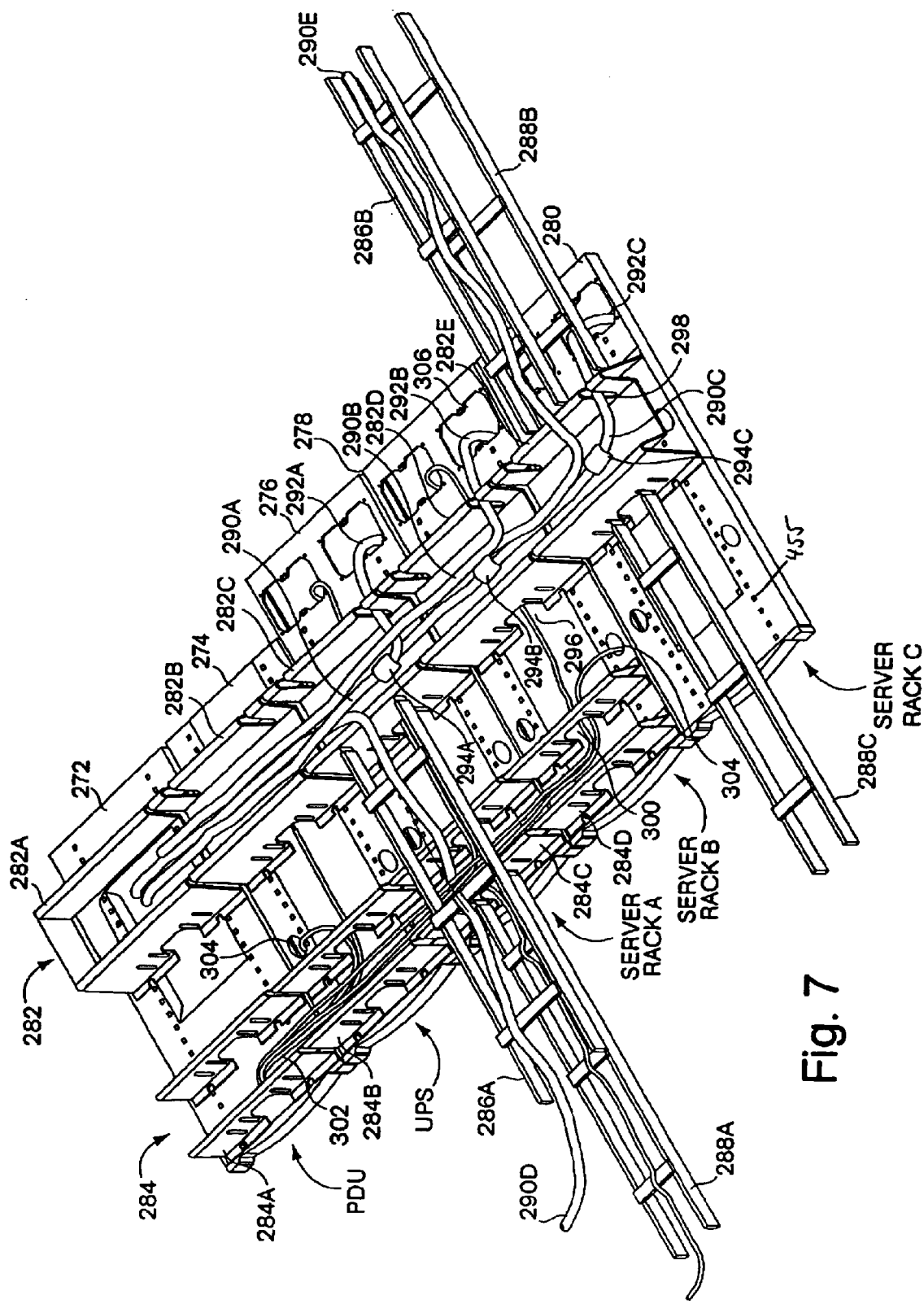
FIG. 7 is a top view of equipment racks of the present invention showing the routing of cables between racks.

FIG. 7 is a top view of racks 208A, 210A, 220A, 220B, and 220C (FIG. 3), and FIG. 7 shows the top panels 273, 274, 276, 278 and 280 of each of the racks and also shows power tracks 282A, 282B, 282C, 282D and 282E and data tracks 284A, 284B, 284C and 284D that run between the racks. The top view of FIG. 7 also shows power bridge tracks 286A and 286B and data bridge tracks 288A, 288B and 288C. The bridge tracks are used in embodiments of the invention to connect the tracks of two racks located, for example, in two rows separated by an aisle to allow power and data cables to pass from one rack to a rack in another aisle. Similarly, bridge tracks may be used for data cables. The top panels 282C, 282D and 284E of the server racks are longer than top panels 282A and 282B of the UPS and PDU racks. The longer top panels extend over the back extension section 258 (FIG. 5) of the server racks.

Figure 11:
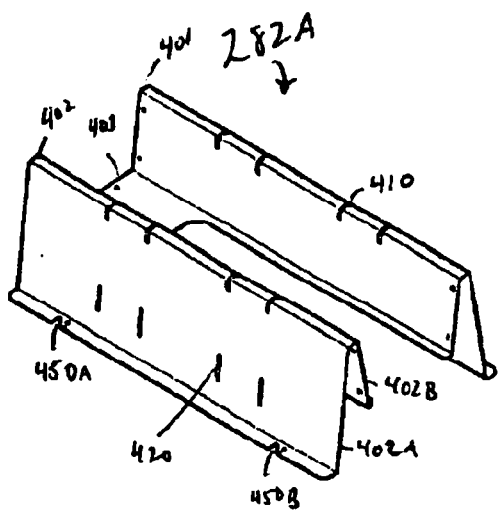
FIG. 11 is a perspective view of a first embodiment of a power track.
Figure 12:
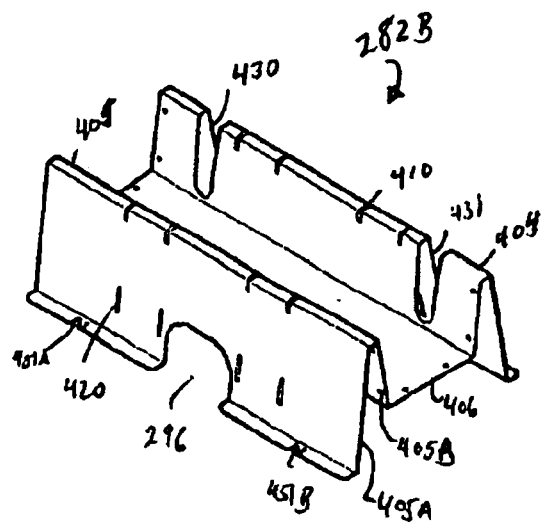
FIG. 12 is a perspective view of a second embodiment of a power track.

Embodiments for the power tracks are illustrated in FIGS. 11 and 12. FIG. 11 illustrates a first embodiment of a power track 282A for use on a PDU rack. The power track 282A has two upstanding sides 401, 402 and a trough 403 between the upstanding sides. The trough 403 extends over only a portion of the power track 282A between the upstanding sides 401, 402. The open portion of the trough 403 allows power cords to extend from the PDU rack into the power track 282A. Each of the upstanding sides 401, 402 is formed as an inverted V having two legs 402A, 402B. The inner leg 402B is shorter than the outer leg 402A and is attached to the trough 403. In this manner, the trough 403 is raised above the rack. FIG. 12 illustrates a second embodiment of a power track 282B for use with non-PDU racks. The second embodiment of the power track 282B also includes two upstanding sides 404, 405 and a trough 406. Each of the upstanding sides 404, 405 are formed as an inverted V having two legs 405A, 405B. The inner leg 405B is shorter than the outer leg 405A and attached to the trough 406. In this manner, as in the first embodiment of the power track, the trough is raised from the level of the rack. One of the upstanding sides 404 has two slots 430, 431 from a top surface down to approximately the level of the trough. Power cables can be placed in either of the notches to pass to the rack below. The outer legs 405A of the upstanding sides 404, 405 have a tunnel 296. The tunnel 296 allows data cables to pass under the trough 406 of the power track to reach openings in the top of the racks.

Figure 14:
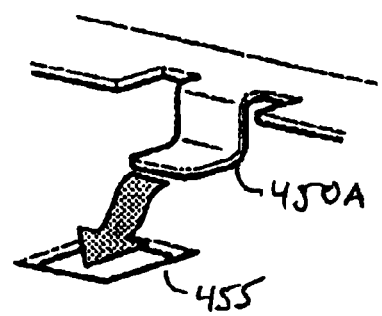
FIG. 14 shows a mounting tab for an embodiment of a track.

Each of the embodiments of the power tracks 282A, 282B has attachment tabs 450A, 450B, 451A, 451B for attaching the power track to the top of a rack. Each power track has four attachment tabs, two on each upstanding side. FIG. 14 illustrates a structure for the attachment tabs. The top of a rack has various attachment holes 455 in parallel lines. To attach a power track to a rack, the lower edges of the upstanding sides 401, 402 of the power track 282A are compressed by hand toward each other. The legs of the upstanding sides 401, 402 allow easy compression of the two upstanding sides. The attachment tabs 450A, 450B are aligned with and inserted in corresponding attachment holes 455 in the rack. When the upstanding sides 401, 402 are released, the attachment tabs 450A, 450B engage the edges of the attachment tabs to hold the track in place. The parallel rows of multiple attachment holes 455 in the top of the rack allow the power tracks to be located in different positions along the top of the rack. However, all of the power tracks for a single set of power cables should be aligned along the top of the racks, as illustrated in FIG. 7. Of course, other designs for attachment tabs and holes could be used. For example, parallel rows of tabs could be placed on the roof section of an equipment rack to mate with holes in the power cable track. The tabs on the power cable track could be arranged to require spreading the upstanding sides rather than compression. The tabs could be arranged to allow movement of the power cable track, endwise or sideways, to engage corresponding holes in the roof section.

Figure 13A:
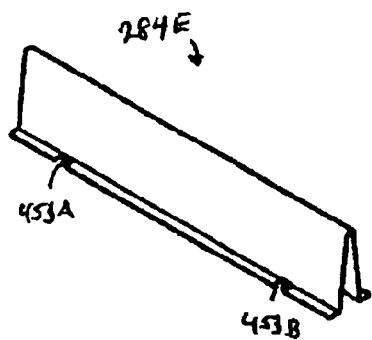
FIGS. 13A and B are perspective views of first and second embodiments of partial data tracks.
Figure 13B:
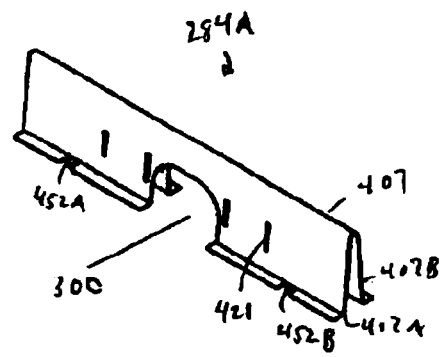

FIGS. 13A and 13B illustrate embodiments of partitions for forming a data track 284. A data track could be formed in the same manner as a power track with a raised trough. Alternatively, the data track can have a trough at the level of the racks. As illustrated in FIGS. 13A and 13B, the data track may also be formed of partitions. Partitions are placed on either side of the data track. By using partitions, different width tracks can be created easily. The data cables may be placed directly on the top of the racks. The partitions serve to maintain the position of the data cables and to provide metal and spatial separation from the power cables to prevent interference. A first embodiment of a partition 284A is illustrated in FIG. 13B. The partition 284A is formed as a single upstanding side 407 having two legs 407A, 407B formed in an inverted V. The partition 284A includes a tunnel 300 for allowing data cables to pass outside the track to openings in the tops of the racks.

Each of the legs 407A, 407B of the partition 284A has two attachment tabs 452A, 452B. The attachment tabs 452A, 452B are identical to the attachment tabs on the power track and as illustrated in FIG. 14. To attach the partition to the top of the rack, the legs 407A, 407B of the upstanding side 407 are compressed. The attachment tabs 452A, 452B are aligned with and inserted in corresponding attachment holes 455 in the top of the rack. When the legs 407A, 407B are released, the attachment tabs engage with the edge of the attachment holes to keep the partition in place. Of course, as with the power cable tracks, other arrangements of tabs and holes could be used on the partitions for attaching the data cable track to the roof section of an equipment rack.

FIG. 13A illustrates a second embodiment of a partition 284E and includes tabs 453A and 453B. The second embodiment is similar to the first embodiment for a partition, but does not include a tunnel 300. The second embodiment of the partition is used when data cables do not need to exit the data track, such as along the front of the rack. Elimination of the tunnel 300 provides better separation between the data cables and power cables and reduces interference.

Figure 15:
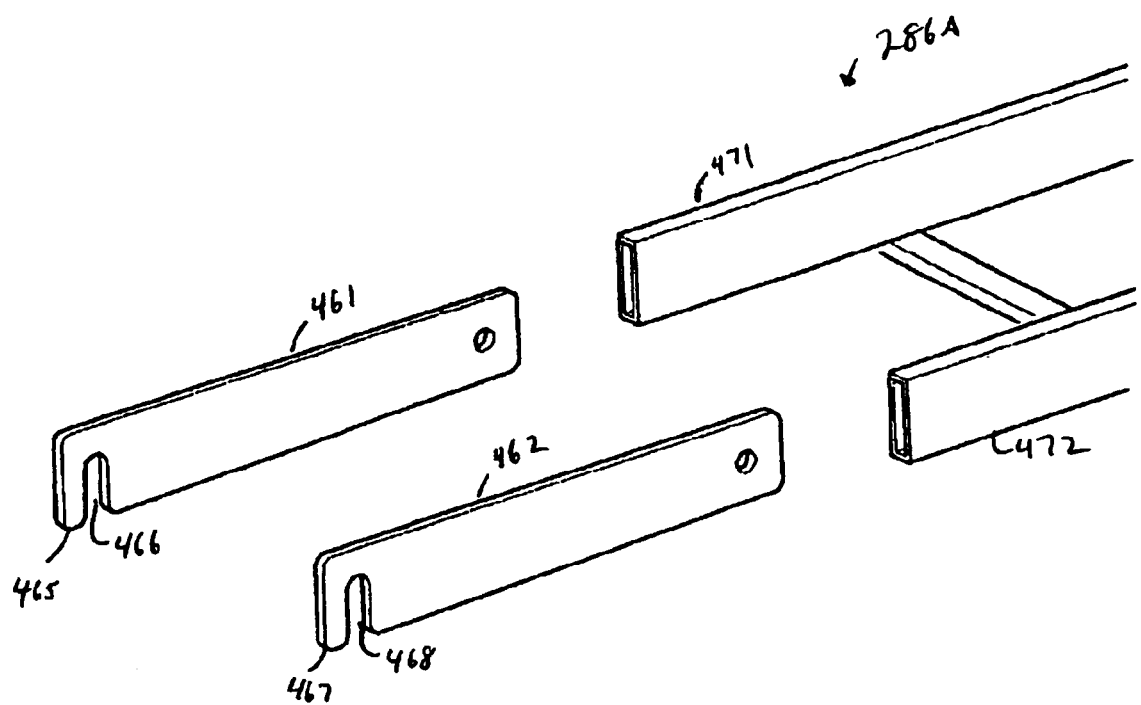
FIG. 15 shows attachment hardware for bridge tracks according to an embodiment of the present invention.
Figure 1:
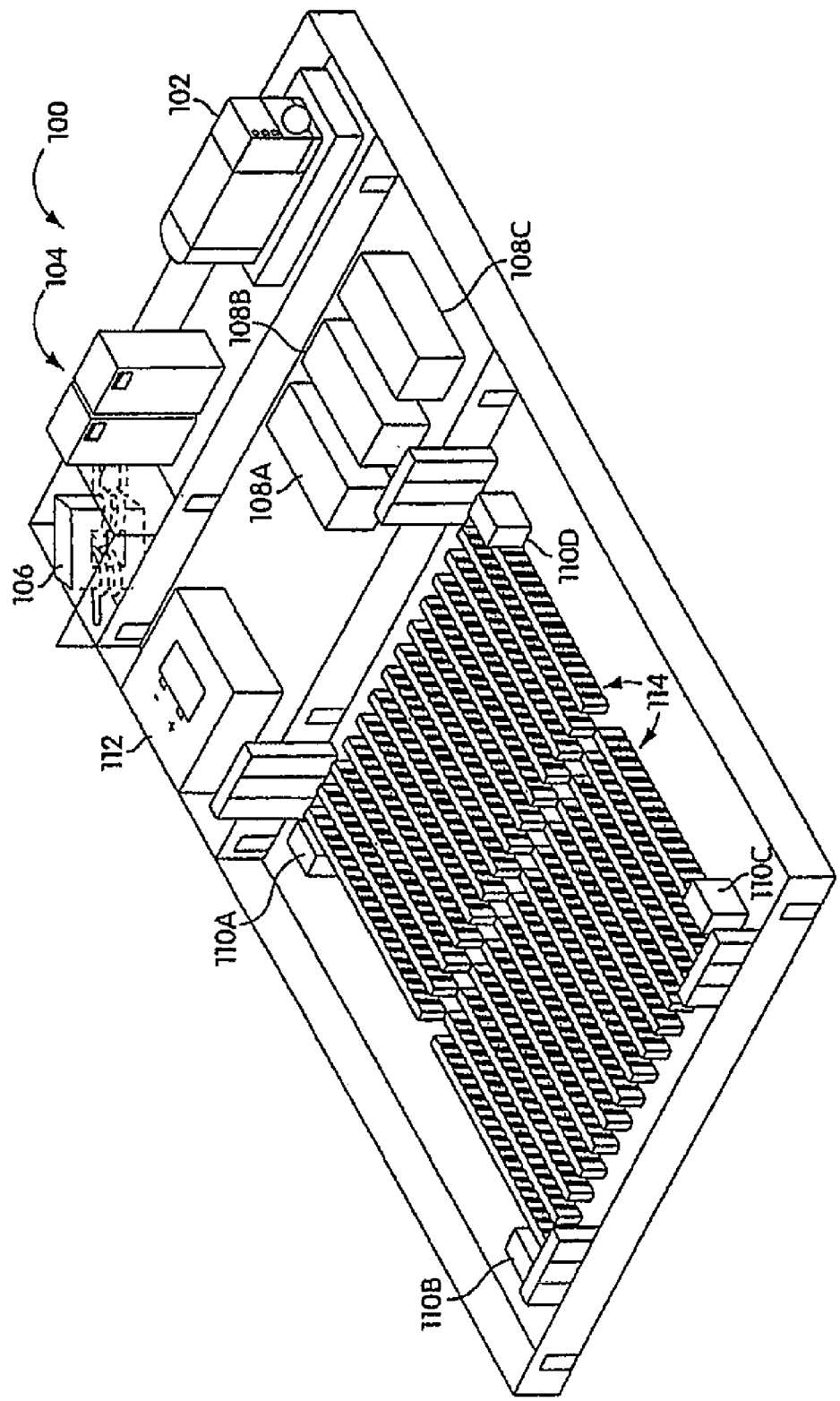
Figure 2:
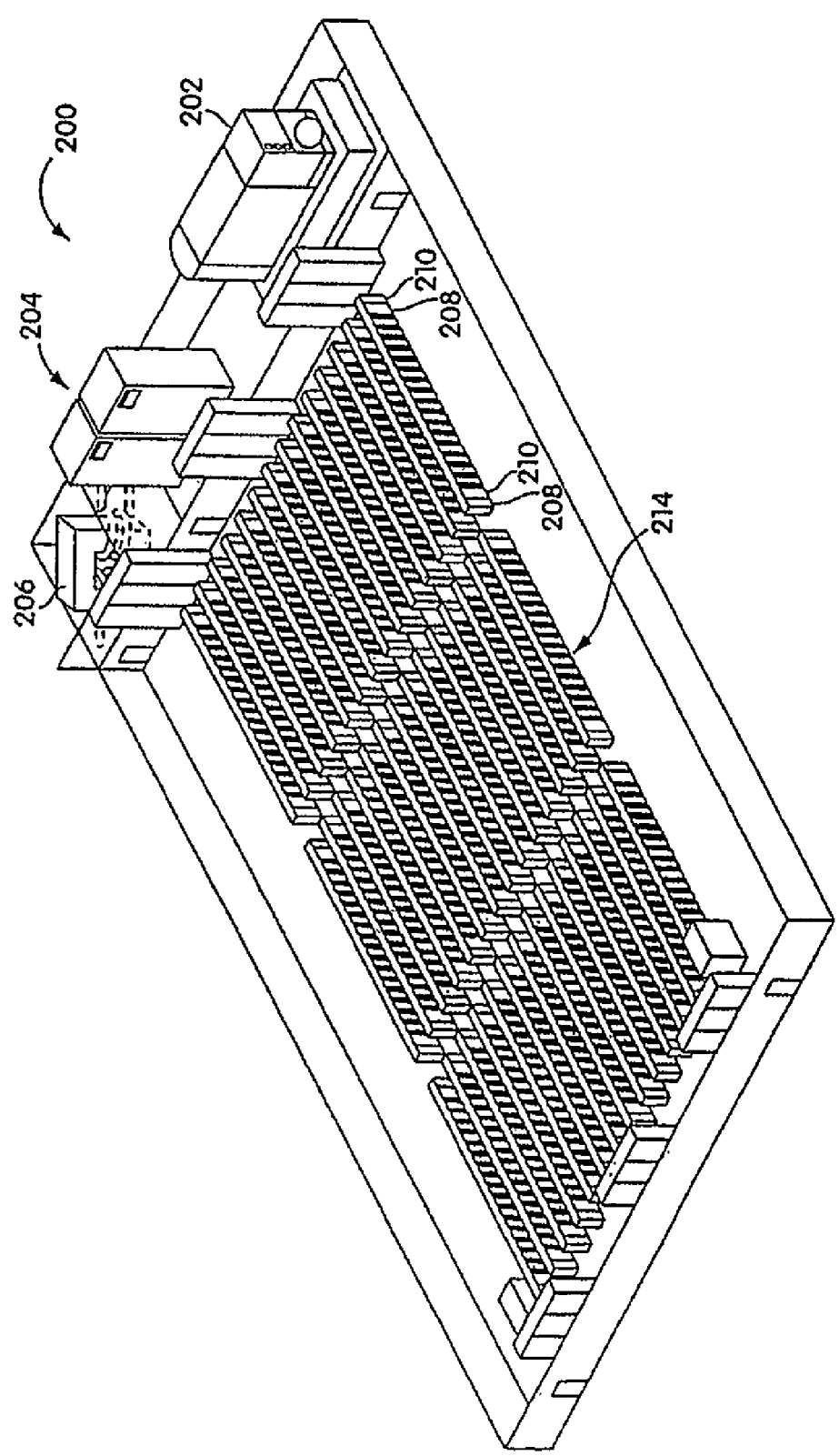
Figure 3:
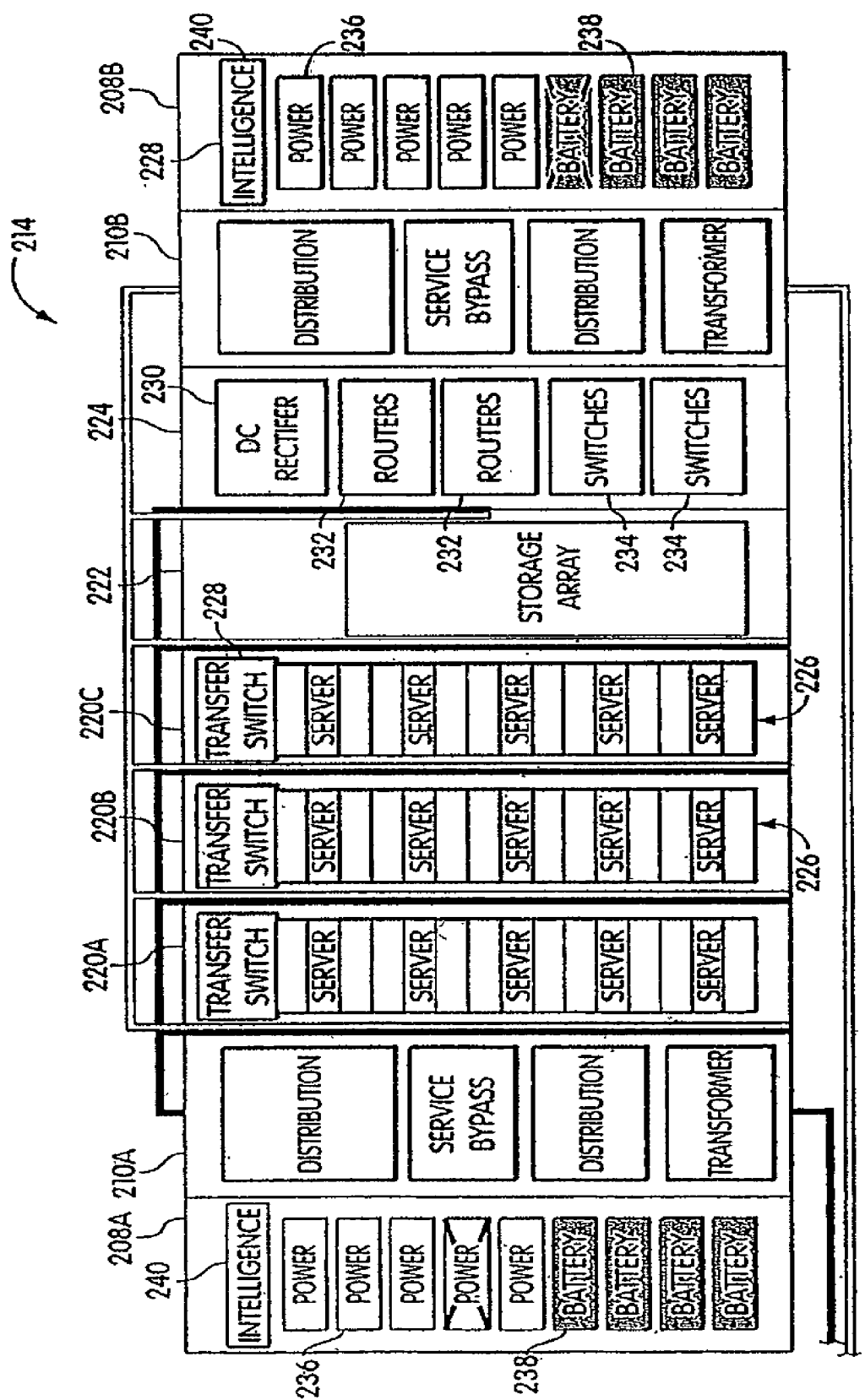
Figure 4:
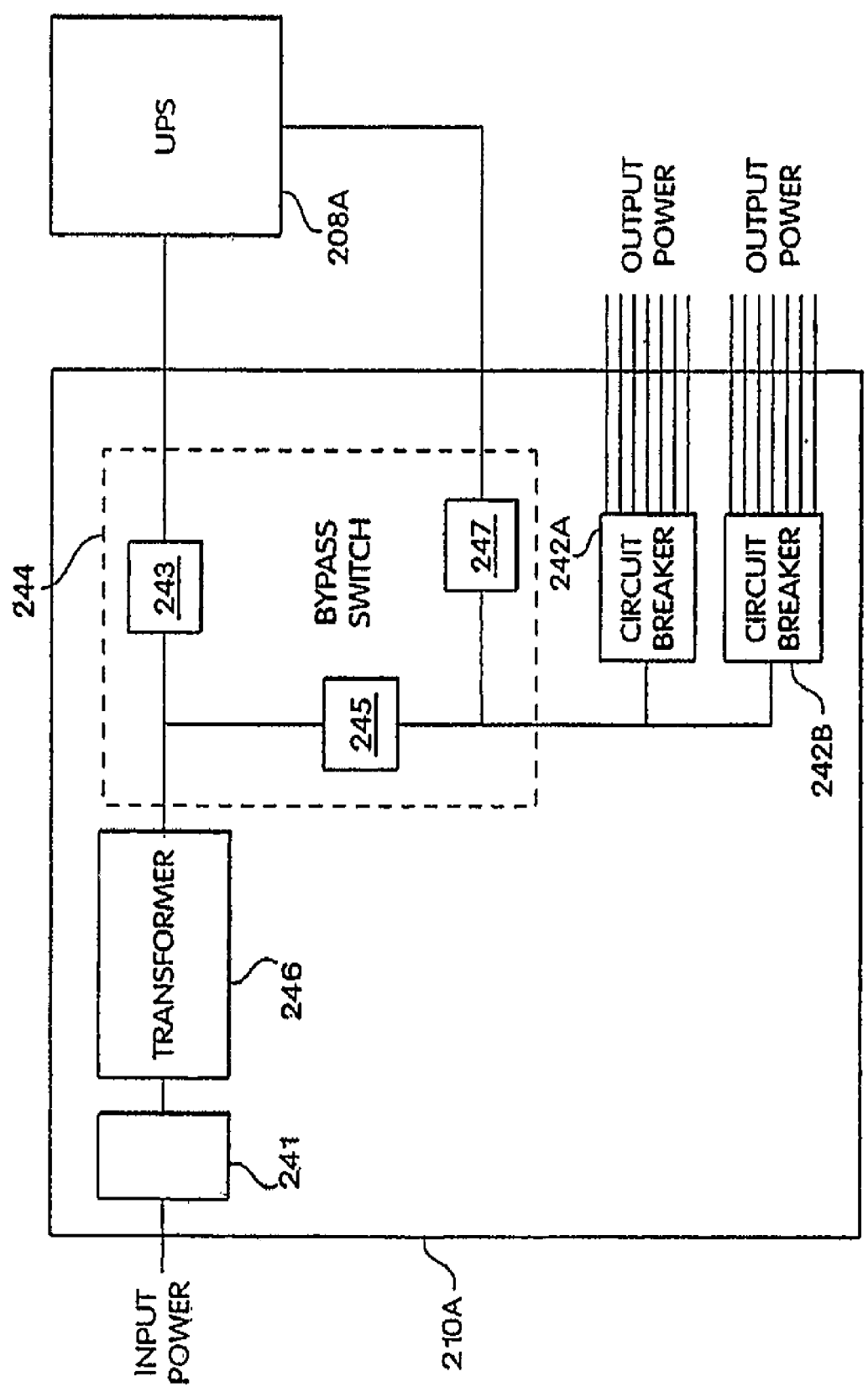
Figure 5:
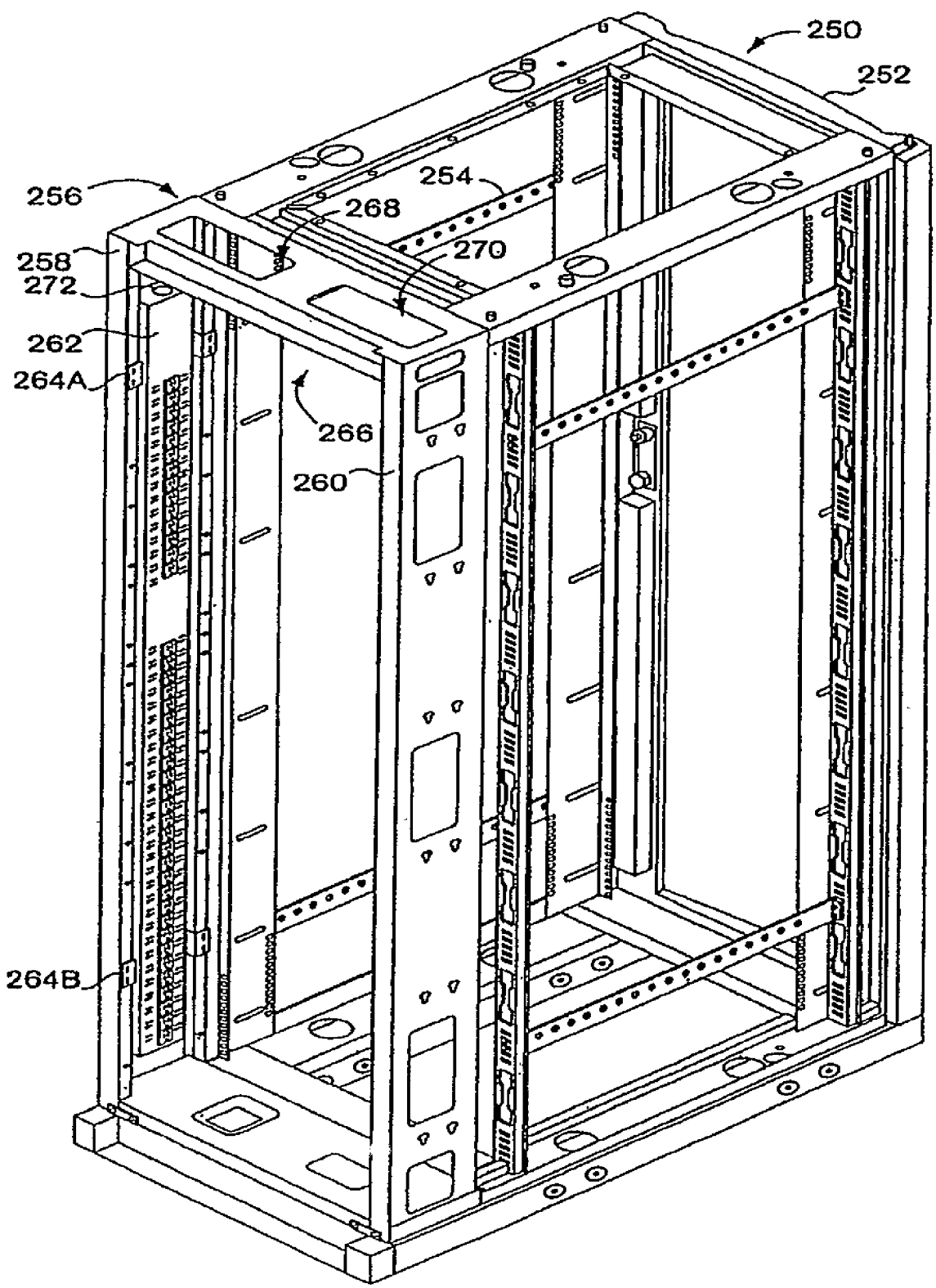
Figure 6:
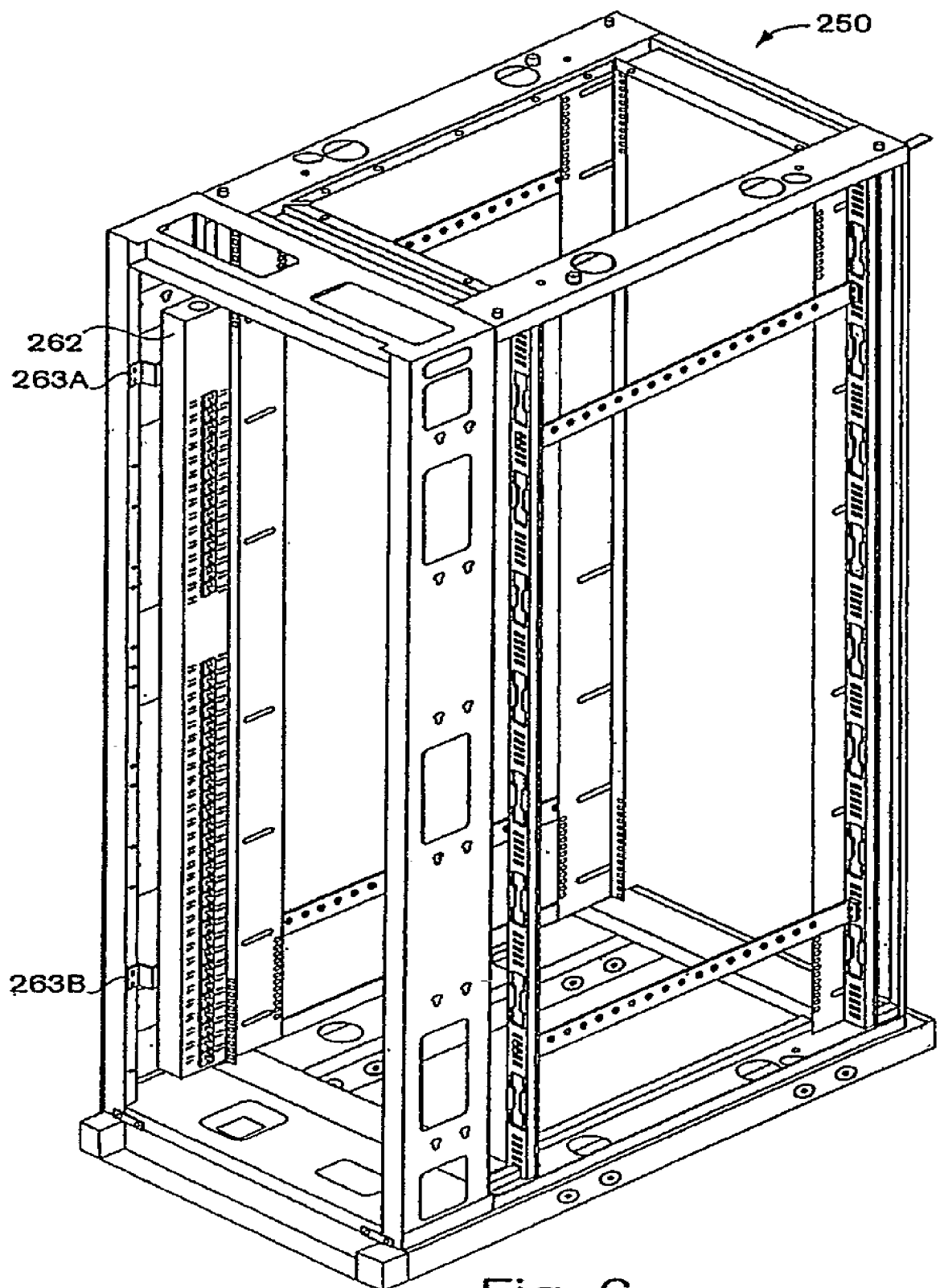
Figure 7:
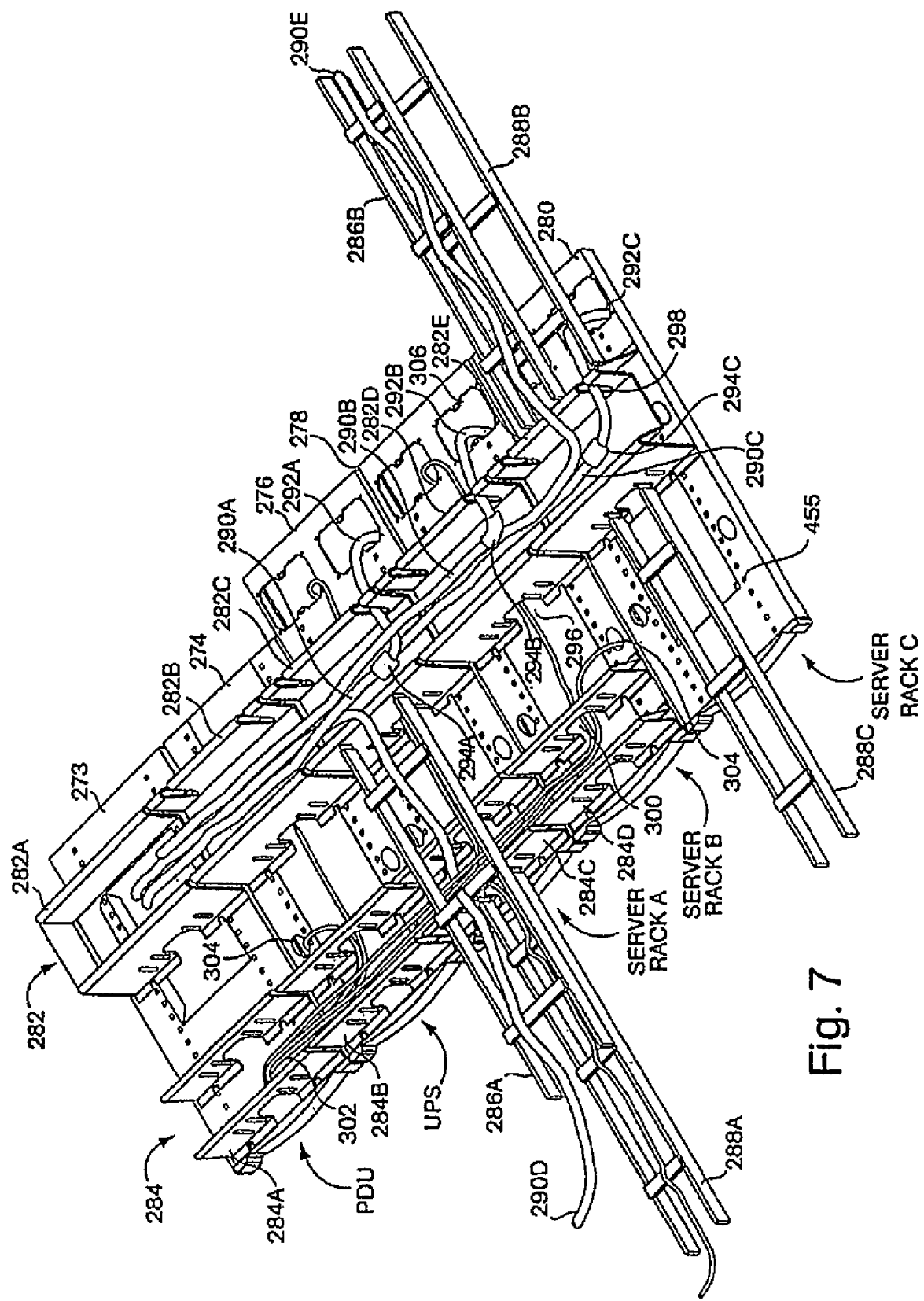
Figure 8:
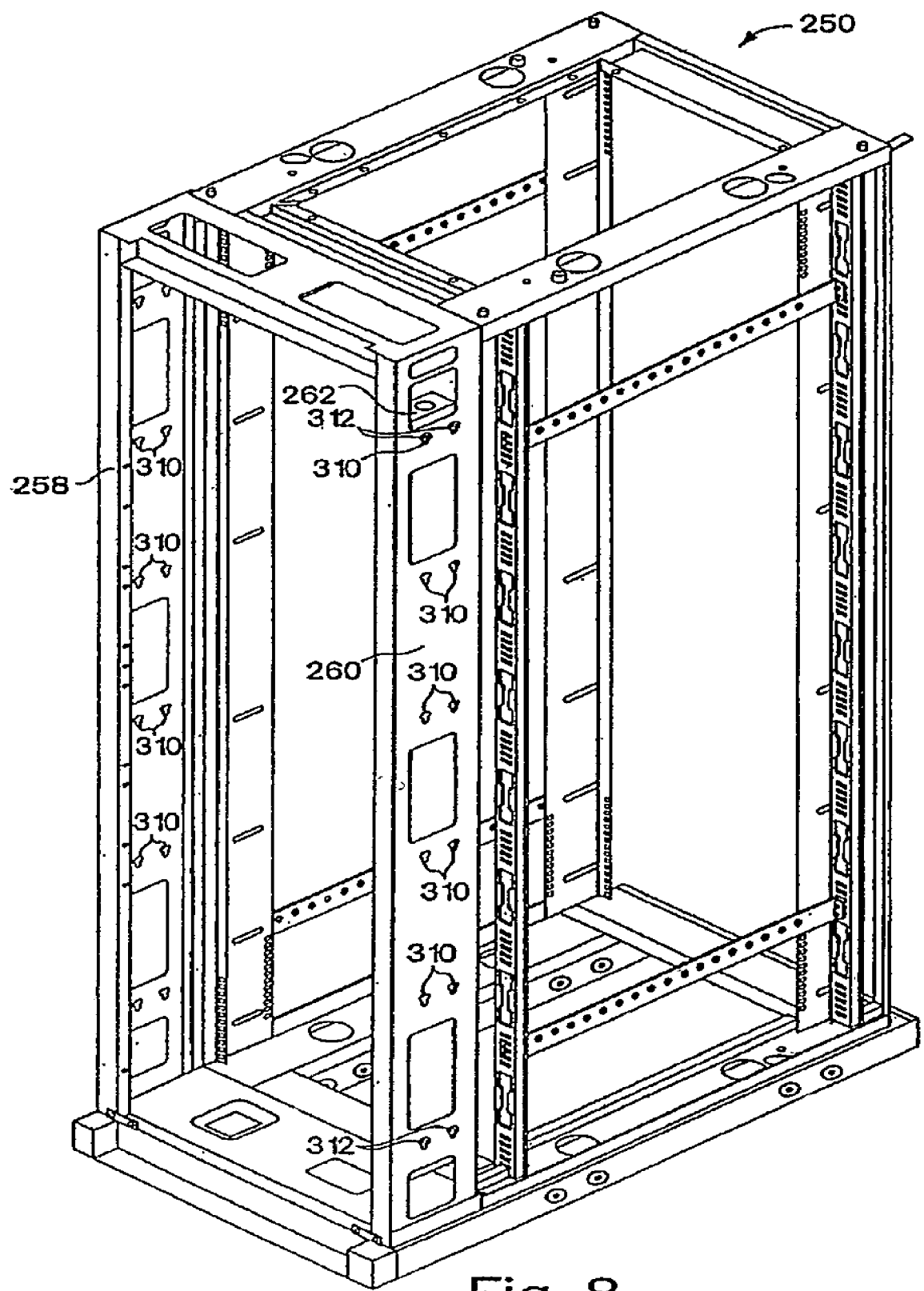
Figure 9A:
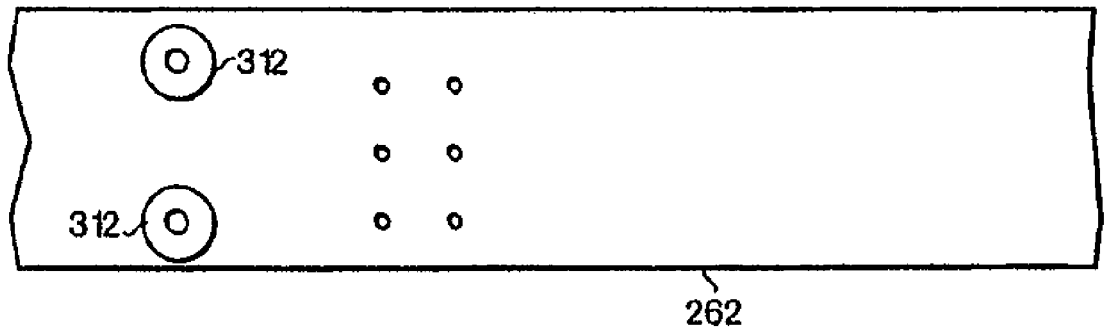
Figure 9B:
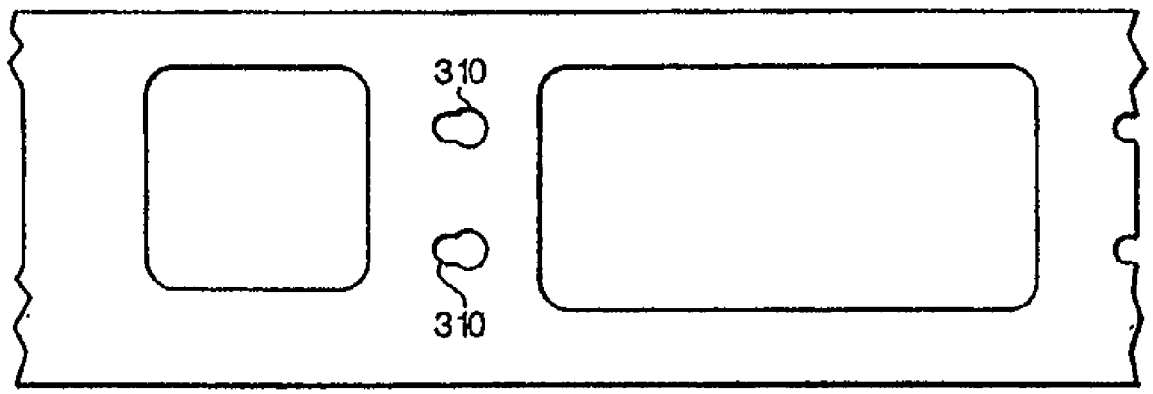
Figure 9C:
Figure 10:
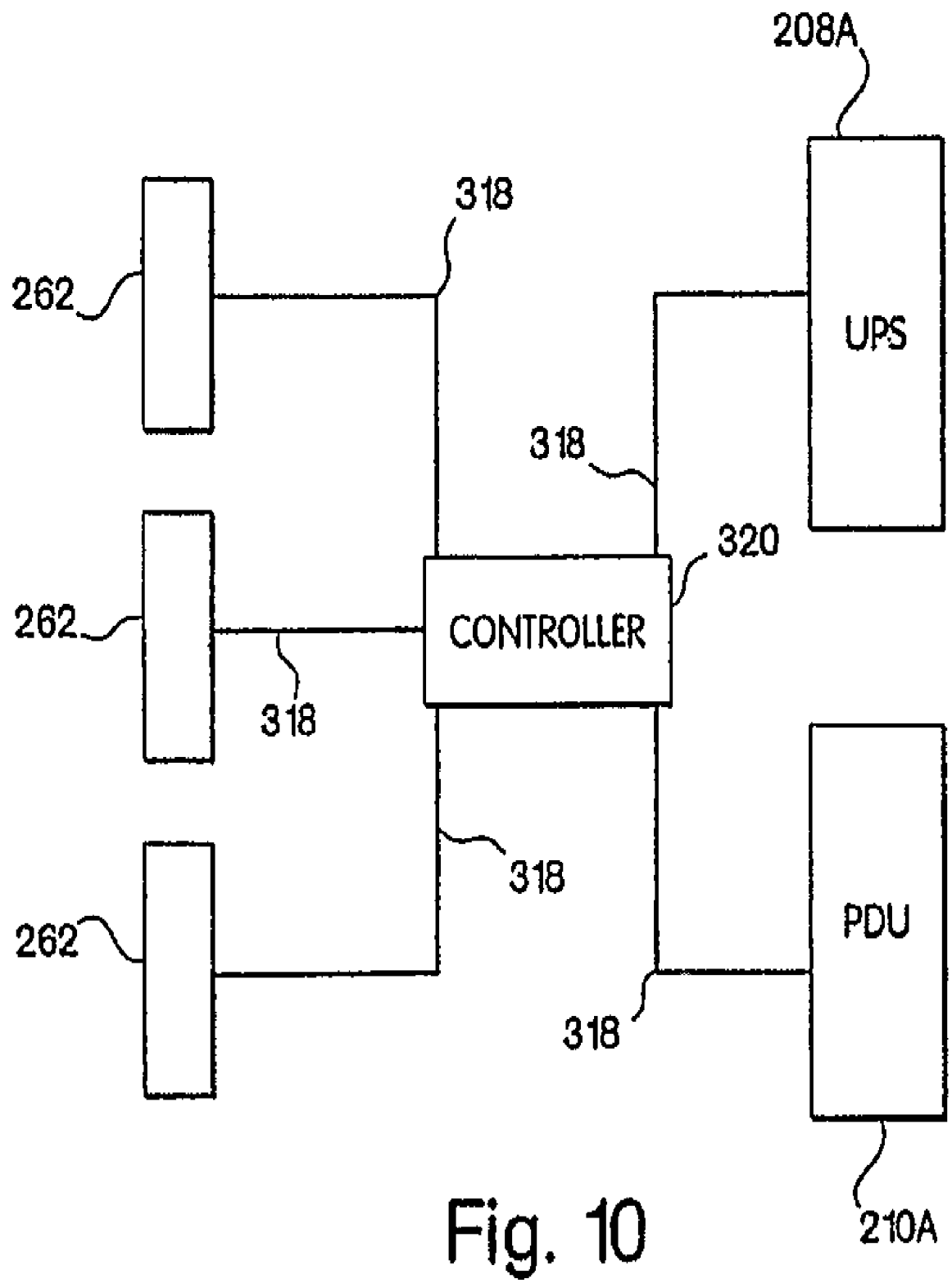
Figure 12:
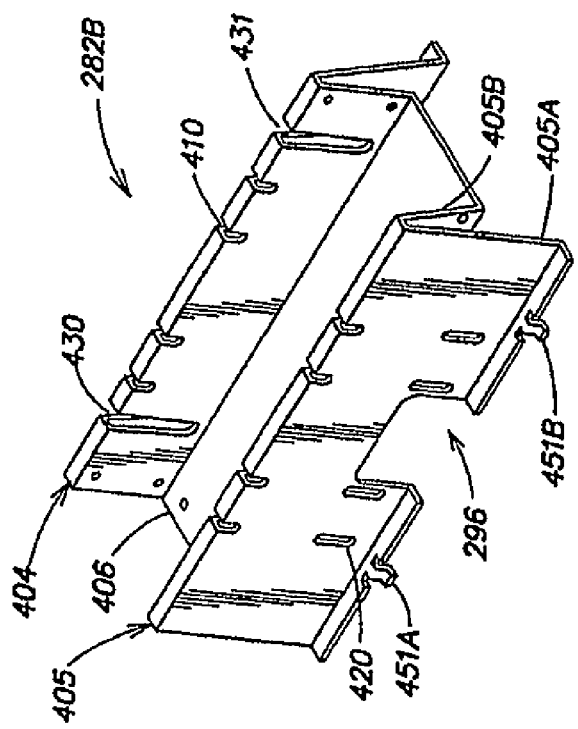
Figure 13B:
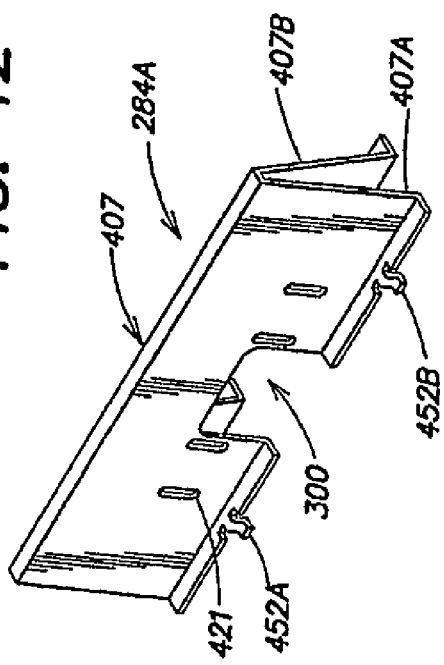
Figure 11:
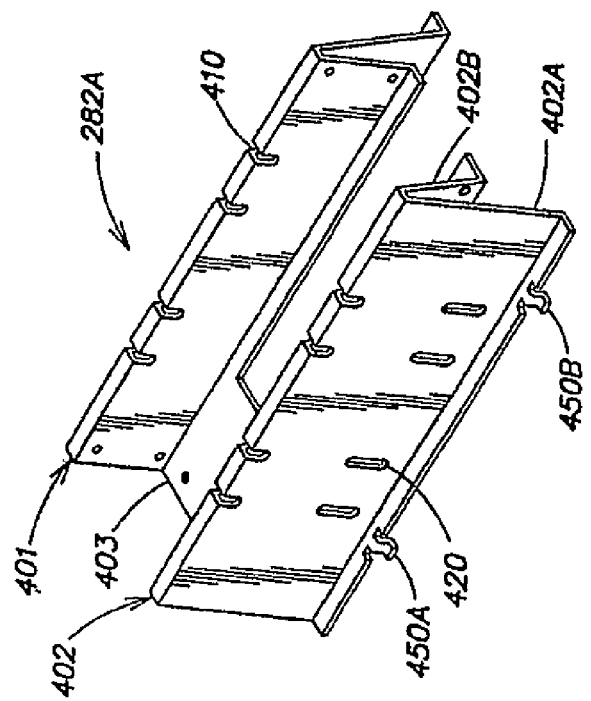
Figure 13A:
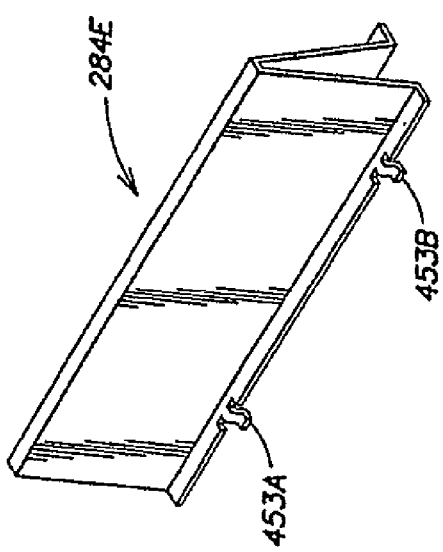
Figure 14:
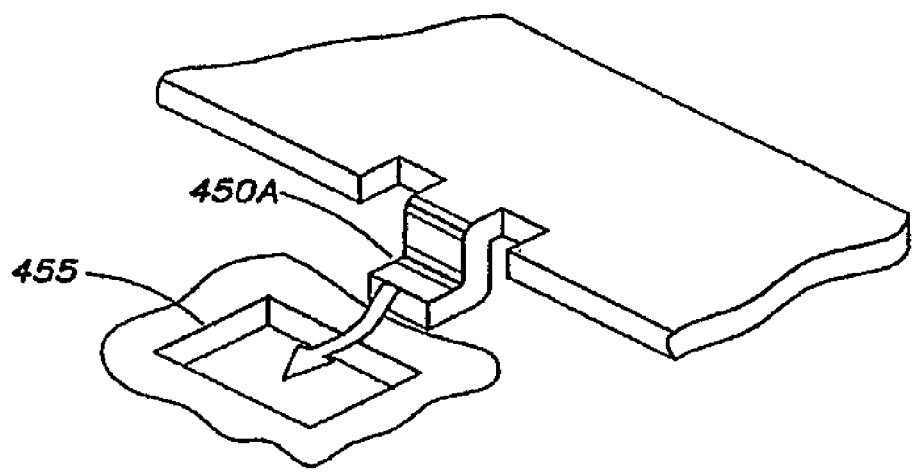
Figure 15:
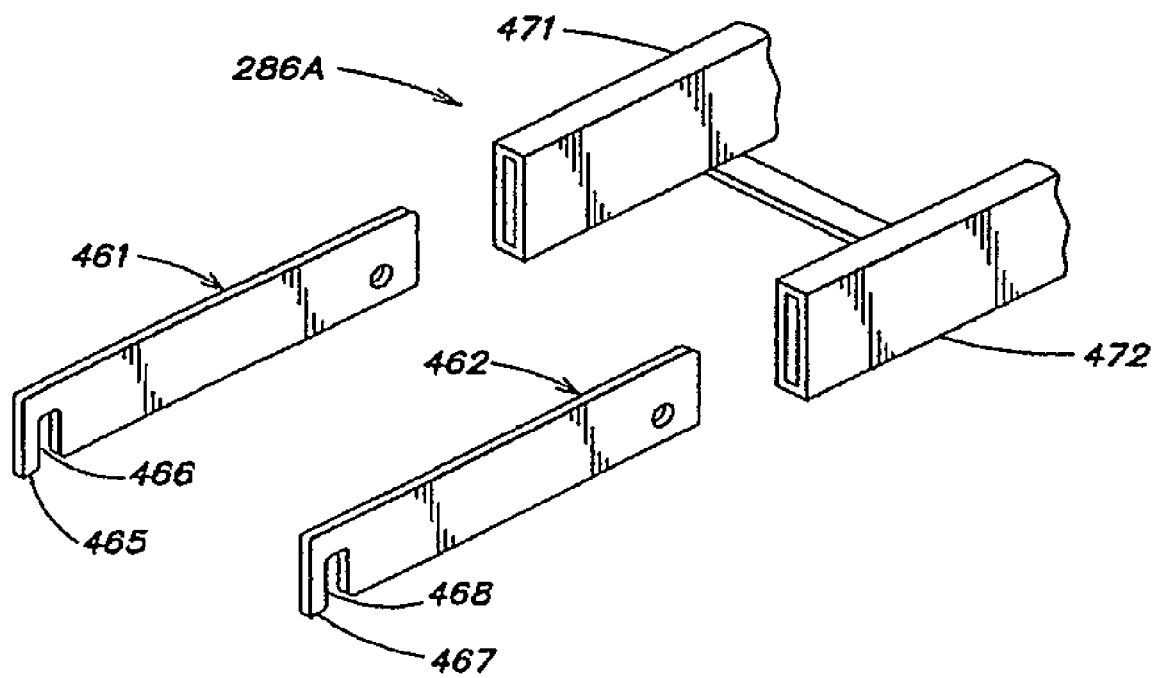

The power data tracks and data cable partitions include bridge slots for attaching cable bridges to the tracks on different sets of tracks. The power tracks, illustrated in FIGS. 11 and 12, have two sets of bridge slots. At upper set of slots 410 are formed in the top of each of the upstanding sides 401, 402. A lower set of slots 420 are formed partway up each of the outer legs of the upstanding sides. The two sets of slots can be used to place bridges at different levels for power and for data. The partitions have a single set of bridge slots 421 corresponding to the lower level on the power tracks. As illustrated in FIG. 7, the upstanding sides of the power tracks 282 are higher than the upstanding sides of the data tracks 284. A power bridge 286A can be placed above or on top of the data tracks 284 and attach to the upper level bridge slots in the power tracks 282. A data bridge 288A can be placed at the lower level from the data tracks 284 below the power bridge 286A. Thus, spatial separation of the power and data cables can be maintained. FIG. 15 illustrates attachment hardware for a data bridge. A bridge 286A, is formed of two rectangular channels 471, 472 attached together in a ladder structure. A ladder bracket 461, 462 is inserted into each of the channels 471, 472. The ladder brackets 461, 462 have a hook 465, 467 and slot 466, 468 at an end which extends from the channels. The hook and slot of a ladder bracket mates with the bridge slots on the power tracks and data tracks. No tools are required to connect the bridges to the tracks.

Each of the power tracks has a slot 298 to allow the input power cables to pass from the openings in the top of the racks into the power tracks, and each of the data tracks has an opening 300 to allow data cables to pass from openings in the top of the racks to the data tracks. Each of the power tracks has a tunnel 296 to allow data cables to pass beneath the power tracks to openings in the top of the racks. In other embodiments, the data tracks may be raised off of the roof of the racks to allow power cables to pass beneath.

In FIG. 7, five flexible power cables 290A, 290B, 290C and 290D pass through the top of the PDU. Cable 290A mates with input power cable 292A of server rack A through mating connector pair 294A, cable 290B mates with input power cable 292B of server rack B through mating connector pair 294B, and cable 290C mates with input power cable 294C of server rack C trough mating connector pair 294C. Power cable 290D passes from the PDU through the power tracks and onto power bridge track 286A. Power cable 290E passes from the PDU through the power tracks and onto power bridge track 286B. Data cables 302 are run in the data tracks and pass into the racks either through holes 304 or holes 306. The data cables may also be run to other racks over data bridge tracks 288A, 288B and 288C.

In one embodiment, each of the flexible power cables is pre-wired into the PDU prior to the delivery of the PDU rack to a data center and the flexible power cables are packaged with and shipped with the PDU. Each of the flexible cables is sized based on the distance from the PDU rack to the equipment rack at which it terminates. In this embodiment, a drawing representing the installation plan for the system, along with a computer aided design (CAD) program may be used to determine the required lengths of the flexible power cables. Since the lengths of the cables are determined prior to installation, the ends of the power cables can be terminated with a connector prior to installation, and therefore, at installation, the power cables may be routed to the racks without any cutting of power wiring during the installation process.

As discussed above with reference to FIG. 5, each of the equipment racks can include two power receptacle units. Each power receptacle unit has a plurality of output receptacles for powering the equipment in the corresponding rack and has an input power cable having a connector which matches the connector of one of the flexible power cables provided by the power distribution unit. As described above, in one embodiment, the power to each of the equipment racks is 208 volts three phase power. In this embodiment, each of the power cables from the PDUs to the equipment racks has at least five conductors, one conductor for each of the phases, a neutral conductor and a ground conductor. In one embodiment, each of the power receptacle units contains a plurality of groups of receptacles, with each group of receptacles wired to provide either 120 volt from one of the three input phases or to provide 208 volt power. Also, in embodiments of the present invention, each outlet in each receptacle unit, or groups of outlets, may be separately protected against overload by a circuit breaker, fuse, or similar device contained within the receptacle unit.

In embodiments of the present invention, the availability in each rack of single phase power from each of three phases of a three phase system significantly simplifies balancing the load on the three phase system. As is known in the art, it is desirable to draw approximately the same current in each phase of a three phase system. In typical prior art systems, power from only one phase is available in each equipment rack in a data center. Accordingly, balancing of the three phase power must occur at the rack level, which is often very difficult to accomplish, particularly for racks having equipment with variable power draw. In contrast, in embodiments of the present invention, balancing of the three phase power can be achieved by switching equipment in a rack from one group of outlets in a receptacle unit to another group of outlets in a receptacle unit.

The provision of both 208 volt power and 120 volt power in racks of the present invention provides additional flexibility over prior art racks that typically are wired for one of 120 volts and 208 volts. In addition, in one embodiment that will now be described with reference to FIG. 8 and FIGS. 9A–9C, the power receptacle units are removably coupled to the racks to allow replacement of a receptacle unit without using tools.

Figure 8:
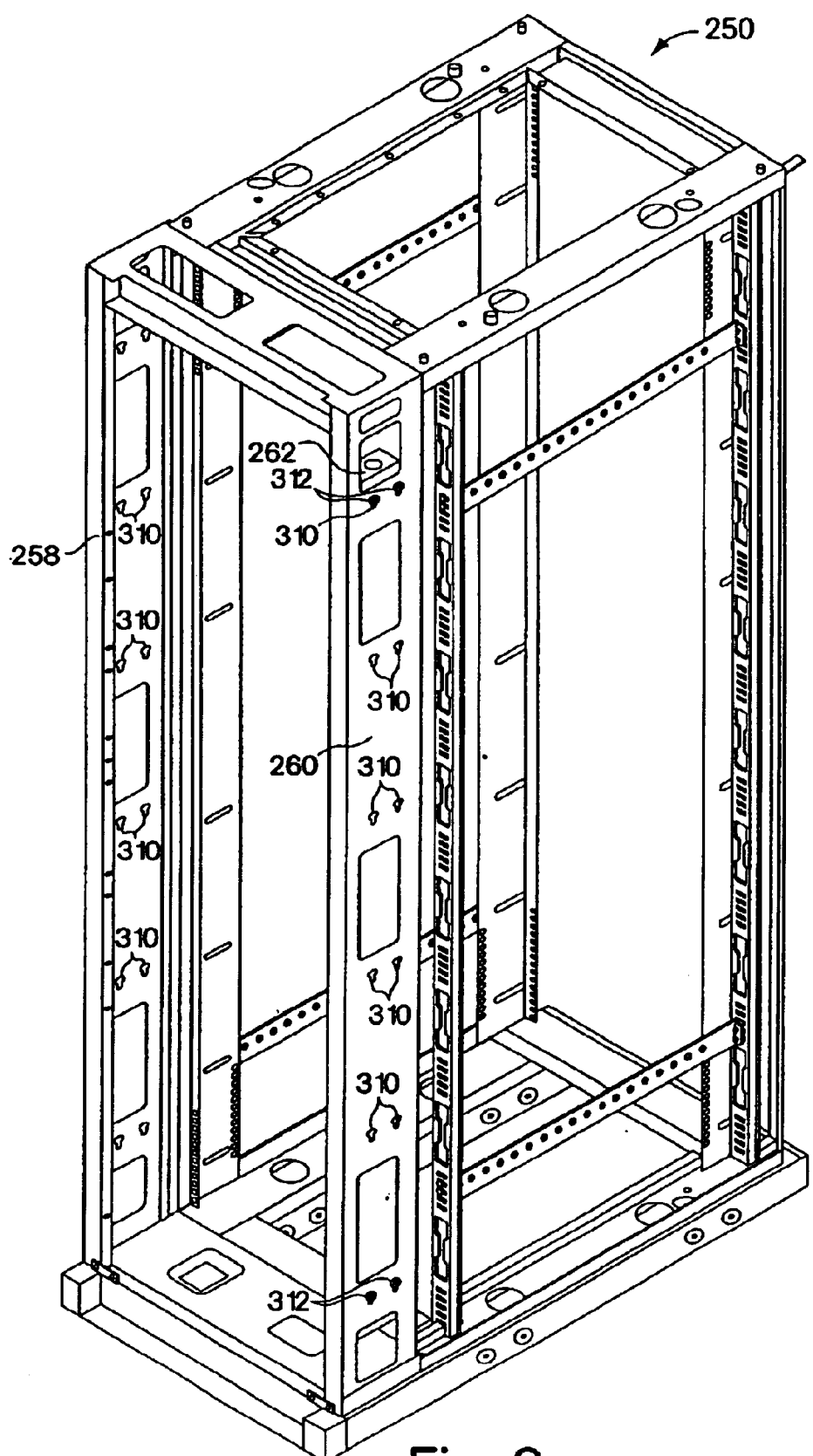
FIG. 8 is a perspective view of the equipment rack of FIG. 5 showing another alternative mounting technique for a power receptacle unit.

FIG. 8 shows a power receptacle unit 262 mounted to the second side panel of the rack 250. As shown in FIG. 8, both the first and second side panels include pairs of slots 310 for mounting a power receptacle unit. In FIG. 8, only one of the slots of each pair is visible for the first side panel of the rack. The power receptacle unit 262 includes two pairs of tabs 312 that mount into two of the pairs of slots 310 to mount the receptacle unit to the rack. In FIG. 8, the tabs 312 mate with the uppermost and lowermost pairs of slots, however, in other embodiments, shorter receptacle units can mate with other pairs of tabs.

Figure 9A:
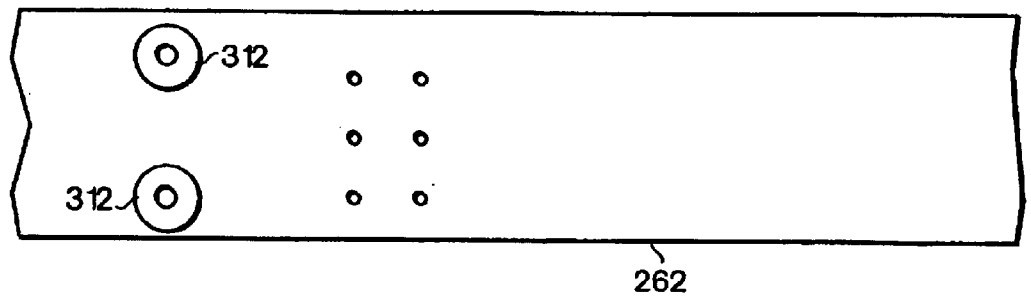
FIG. 9A shows a top view of a portion of the power receptacle unit of FIG. 8 in greater detail.
Figure 9B:
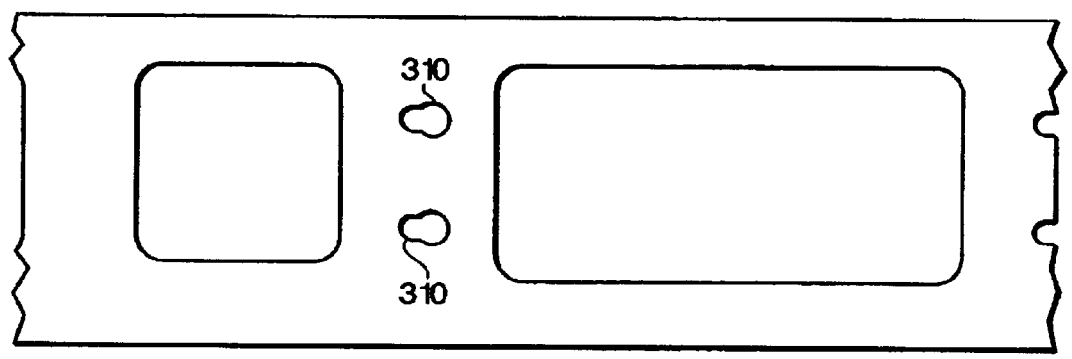
FIG. 9B shows a mounting portion for a power receptacle unit of the rack of FIG. 8 in greater detail.
Figure 9C:
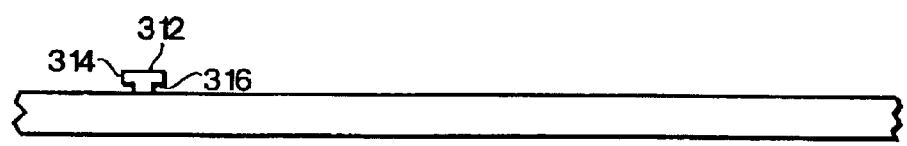
FIG. 9C is a side view of the portion of the power receptacle unit of FIG. 9A.

FIG. 9A shows a top view of a portion of the receptacle unit 262 including one of the pairs of tabs 312, and FIG. 9C shows a side view of the portion of the receptacle unit 262. FIG. 9B shows a front view of a portion of the second side panel 260 illustrating one of the pairs of slots 310 in greater detail. As best seen in FIG. 9C, each of the tabs 312 has a top portion 314 and a neck 316. When mounting the receptacle 262, the top portion 314 is inserted through the larger portion of the slot 310, and the receptacle is then moved so that the neck 316 is in the narrow portion of the slot 310, so that the top portion of the tab holds the receptacle unit in the slot.

The ability to easily replace receptacle units in racks of the present invention provides further flexibility to accommodate a greater variety of equipment. For example, a receptacle unit having all 120 volt outlets may be replaced with a receptacle unit having a mixture of 120 volt and 208 volt outlets, or all 208 volt outlets if 120 volt equipment is replaced by 240 volt equipment.

As discussed above, each of the equipment racks may have two power receptacle units coupled to two different UPSs through two different PDUs and two different flexible power cables. As described above with reference to FIGS. 2 and 3, in one embodiment having two UPSs and two PDU racks for powering a series of equipment racks, the equipment racks are arranged in a row with one UPS and one PDU rack positioned at each end of the row. By positioning the PDUs at opposite ends of the row, the number of cables at any one time in the overhead tracks can be uniform. In other embodiments of the invention, the equipment racks do not need to be contained in one linear row, but rather, could be in multiple rows or the racks may be arranged in a non-linear fashion. Overhead bridges between the tracks may be used to run the flexible cabling between non-adjacent racks.

Figure 10:
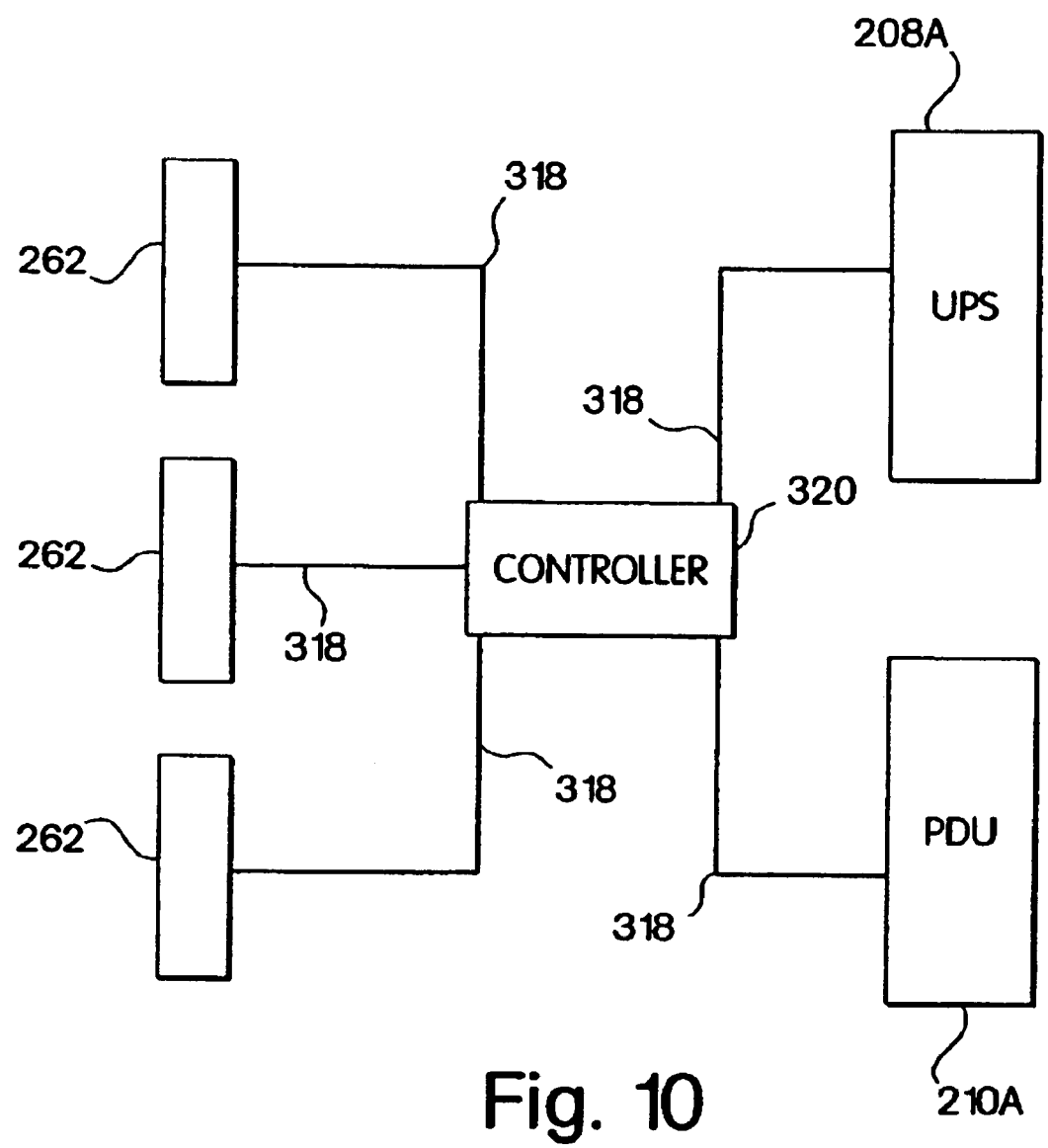
FIG. 10 is a diagram showing the interconnectivity of a communications bus used in embodiments of the present invention.

In one embodiment, each of the UPSs, the PDUs and the power receptacle units may include a communication circuit for status monitoring by a controller via a common communication bus. FIG. 10 shows a number of receptacles 262, one of the UPSs, and one of the PDUs of a power distribution network of the present invention, coupled over a communication bus 318 to the controller 320 to allow status monitoring of the power distribution system. The communication bus may be implemented using any one of a number of known network topologies, and in one embodiment, is implemented using a modified version of the Common Application Standard (CAL) over IP in addition to SNMP and HTTP. In another embodiment, the communication bus may be implemented using a power line carrier network.

In one embodiment, the controller provides consolidated information to an IP based network using SNMP, HTTP or some other known protocol. The controller may also include software to prevent access from the IP network to the communications bus. The controller may be mounted in one of the equipment racks, in a PDU rack or in a UPS rack.

In one embodiment of the present invention, some or all of the receptacle units contain current (or power) monitoring devices for monitoring the total current through the receptacle or the current through each of the outlets of the receptacle. In this embodiment, the current measured in the receptacles can be communicated to the controller over the communications bus to allow the controller to detect any present or impending over current conditions. In one embodiment, additional current (or power) monitors, coupled to the communications bus, can be distributed throughout the power distribution network to provide values of current (or power) to the controller. In addition, each of the receptacles may have a display that displays the current or power draw for the receptacle unit to determine if additional devices can be powered from the unit. Further, as described in copending U.S. patent application Ser. No. "Not Yet Assigned", filed on Jan. 2, 2002, titled METHODS AND APPARATUS FOR PREVENTING OVERLOADS OF POWER DISTRIBUTION NETWORKS, assigned to the assignee of the present application, and incorporated herein by reference, the controller and power monitoring devices can be used in conjunction with the controller along with software contained in computers contained in the equipment racks to determine maximum power levels in the power distribution system.

In FIG. 3, the UPSs are placed at the ends of the rows of racks. Embodiments of the present invention are not limited to systems in which the UPS racks are placed at the ends, however, as described above, in embodiments of the present invention, there are advantages to placing the UPSs at the end of the rows. Specifically, the placement of the UPSs at the end of the rows allows easy access to the UPSs for replacement for repair or upgrade. Further, in redundant power systems having two PDUs, as described above, the placement of the PDUs at the ends of the rows allows the number of cables at any point in the tracks in a row of racks to be kept uniform. Nonetheless, in other embodiments of the present invention, the UPSs and PDUs may be installed in the center of a row or at any other position in a row of racks.

In embodiments discussed above, racks are described as being arranged in rows. In different embodiments, rows of racks may be linear rows, curved rows, have spaces (i.e., aisles) between racks, or be arranged in some other configuration.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A power cable track for attachment to a roof section of a corresponding equipment rack to form a continuous power cable track across a plurality of equipment racks, the power cable track comprising:

two upstanding sides; and
a trough between the two upstanding sides;
wherein each of the two upstanding sides includes two legs in an inverted V configuration;
wherein the two legs of an upstanding side include an outer leg and an inner leg shorter than the outer leg; and
wherein the inner leg is attached to the trough.

2. The power cable track of claim 1, further comprising:
a plurality of attachment tabs on a lower surface of the two upstanding sides. below the trough.

3. The power cable track according to claim 1, wherein the two upstanding sides can be flexed toward the trough.

4. The power cable track according to claim 1, further comprising at least one cable slot in at least one of the two upstanding sides.

5. The power cable track of claim 2, in combination with an equipment rack, wherein the power cable track is positioned on a top portion of the equipment rack.

6. A power cable track for attachment to a roof section of a corresponding equipment rack to form a continuous power cable track across a plurality of equipment racks, the power cable track comprising:

two upstanding sides;

a trough, coupled to each of the two upstanding sides, and configured to maintain a power cable in the trough at a distance above the roof section; and a plurality of bridge slots in at least one upstanding side for accepting a bracket of a bridge power cable track.

7. A cable track for attachment to a roof section of an equipment rack, the cable track comprising:

a first upstanding side having an elongated section;

a second upstanding side having an elongated section arranged substantially parallel to the elongated section of the first upstanding side;

a trough section coupled between the first upstanding side and the second upstanding side to support a cable; and means for removably attaching the first upstanding side and the second upstanding side to holes in a roof section of an equipment rack;

wherein each of the first and the second upstanding sides includes two legs in an inverted V configuration;

wherein the two legs of an upstanding side include an outer leg and an inner leg shorter than the outer leg; and wherein the inner leg is attached to the trough section.

8. A cable track for attachment to a roof section of an equipment rack, the cable track comprising:

a first upstanding side having an elongated section;

a second upstanding side having an elongated section arranged substantially parallel to the elongated section of the first upstanding side;

a trough section coupled between the first upstanding side and the second upstanding side to support a cable above the roof section;

means for removably attaching the first upstanding side and the second upstanding side to holes in a roof section of an equipment rack; and a plurality of bridge slots in at least one of the first and the second upstanding sides for accepting a bracket of a bridge cable track.

9. The cable track according to claim 8, wherein the first and second upstanding sides are constructed and arranged to be flexible toward the trough.

10. The cable track according to claim 8, further comprising at least one cable slot in at least one of the first and the second upstanding sides.

11. The cable track of claim 8, in combination with an equipment rack, wherein the cable track is positioned on a top portion of the equipment rack.

12. A power cable track for attachment to a roof section of a corresponding equipment rack to form a continuous power cable track across a plurality of equipment racks, the power cable track comprising:

two upstanding sides;

a trough, coupled to each of the two upstanding sides, and configured to maintain a power cable in the trough at a distance above the roof section; and wherein each of the two upstanding sides has an opening formed therein, positioned to allow a cable to pass through the opening in each of the two upstanding sides 13. A cable track for attachment to a roof section of an equipment rack the cable track comprising:

a first upstanding side having an elongated section;

a second upstanding side having an elongated section arranged substantially parallel to the elongated section of the first upstanding side;

a trough section coupled between the first upstanding side and the second upstanding side to support a cable above the roof section;

means for removably attaching the first upstanding side and the second upstanding side to holes in a roof section of an equipment rack; and means for allowing a cable to pass through the first upstanding side and the second upstanding side beneath the trough section.

* * * * *

UNITED STATES PATENT AND TRADEMARK OFFICE
CERTIFICATE OF CORRECTION

PATENT NO. : 6,992,247 B2
APPLICATION NO. : 10/284835
DATED : January 31, 2006
INVENTOR(S) : Rasmussen et al.

It is certified that error appears in the above-identified patent and that said Letters Patent is hereby corrected as shown below:

The title page showing an illustrative figure(s) 12 should be deleted and substitute therefore the attached title page consisting of Fig(s). 12.

The drawing sheets consisting of Fig(s) 1-15 should be deleted and substitute therefore the attached drawing sheets consisting of Fig(s) 1-15.

Column 16, line 65, after "upstanding sides", --below the trough-- should be deleted.

Column 18, line 26, after "upstanding sides, --below the trough -- should be inserted.

Signed and Sealed this

Twenty-third Day of January, 2007

JON W. DUDAS
*Director of the United States Patent and Trademark Office*